United States Patent
Afghahi et al.

(10) Patent No.: US 6,707,316 B2
(45) Date of Patent: *Mar. 16, 2004

(54) CIRCUIT TECHNIQUE FOR HIGH SPEED LOW POWER DATA TRANSFER BUS

(75) Inventors: Morteza Cyrus Afghahi, Irvine, CA (US); Esin Terzioglu, Irvine, CA (US); Mehdi Hatamian, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/145,921

(22) Filed: May 15, 2002

(65) Prior Publication Data

US 2002/0175707 A1 Nov. 28, 2002

Related U.S. Application Data

(63) Continuation of application No. 09/776,028, filed on Feb. 2, 2001, now Pat. No. 6,417,697.
(60) Provisional application No. 60/215,741, filed on Jun. 29, 2000, provisional application No. 60/193,607, filed on Mar. 31, 2000, provisional application No. 60/179,766, filed on Feb. 2, 2000, provisional application No. 60/179,777, filed on Feb. 2, 2000, provisional application No. 60/193,605, filed on Mar. 31, 2000, provisional application No. 60/179,766, filed on Feb. 2, 2000, provisional application No. 60/220,567, filed on Jul. 25, 2000, provisional application No. 60/179,866, filed on Feb. 2, 2000, provisional application No. 60/179,718, filed on Feb. 2, 2000, provisional application No. 60/179,765, filed on Feb. 2, 2000, provisional application No. 60/179,768, filed on Feb. 2, 2000, and provisional application No. 60/179,865, filed on Feb. 2, 2000.

(51) Int. Cl.[7] .......................................... H03K 19/0175
(52) U.S. Cl. ............................ 326/86; 326/90; 326/112
(58) Field of Search ................................ 326/82, 83, 86, 326/90, 112, 119, 113, 121

(56) References Cited

U.S. PATENT DOCUMENTS

| | | | | | |
|---|---|---|---|---|---|
| 4,835,418 A | * | 5/1989 | Hsieh | .......................... | 307/473 |
| 5,491,428 A | * | 2/1996 | Pan | .............................. | 326/17 |

* cited by examiner

*Primary Examiner*—Anh Tran
(74) *Attorney, Agent, or Firm*—McAndrews, Held & Malloy, Ltd.

(57) ABSTRACT

A high speed low power data transfer bus circuit that reduces bus power consumption by imposing a limited, controlled voltage swing on the associated data bus. In one embodiment, an inverter is coupled with a pMOS pass transistor and an nMOS discharge transistor, and the combination is coupled with a data bus. The discharge transistor and pass transistor can be programmed to provide a preselected bus operational characteristics. In another embodiment, multiple nMOS discharge transistors can be coupled to the data bus via the pass transistor, with each of the discharge transistors being selectively programmed to provide additional preselected bus operational characteristics, multiple, programmable discharge transistors, thus selectably imposing encoded and multilevel logic signals on the data bus. In another embodiment, a bidirectional data transfer bus circuit couples two data busses while imposing a limited, controlled voltage swing during the transfer. One preferred embodiment couples a first data bus and a second data bus with cross-linked inverters. Interposed between the inverters, and its associated bus, is a respective pMOS pass transistor. Also, coupled between each input node and ground, is a signal discharge transistor, preferably nMOS, which facilitates data transfer between the buses. Each of the inverters is coupled with a clocked charge/discharge circuit, preferably using a common clock signal.

10 Claims, 22 Drawing Sheets

CIRCUIT TECHNIQUE FOR HIGH SPEED LOW POWER DATA TRANSFER BUS

CROSS-REFERENCE TO RELATED APPLICATION(S)

The present application is a continuation of U.S. patent application Ser. No. 09/776,028, filed Feb. 2, 2001 is now a U.S. Pat. No. 6,417,697, entitled "Circuit Technique for High Speed Low Power Data Transfer Bus," claims the benefit of the filing dates of the following U.S. Provisional Patent Applications, the contents of all of which are hereby expressly incorporated herein by reference:

Serial No. 60/215,741, filed Jun. 29, 2000, and entitled MEMORY MODULE WITH HIERARCHICAL FUNCTIONALITY;

Serial No. 60/193,607, filed Mar. 31, 2000, and entitled MEMORY REDUNDANCY IMPLEMENTATION;

Serial No. 60/193,606, filed Mar. 31, 2000, and entitled DIFFUSION REPLICA DELAY CIRCUIT;

Serial No. 60/179,777, filed Feb. 2, 2000, and entitled SPLIT DUMMY BITLINES FOR FAST, LOW POWER MEMORY;

Serial No. 60/193,605, filed Mar. 31, 2000, and entitled A CIRCUIT TECHNIQUE FOR HIGH SPEED LOW POWER DATA TRANSFER BUS;

Serial No. 60/179,766, filed Feb. 2, 2000, and entitled FAST DECODER WITH ASYNCHRONOUS RESET;

Serial No. 60/220,567, filed Jul. 25, 2000, and entitled FAST DECODER WITH ROW REDUNDANCY;

Serial No. 60/179,866, filed Feb. 2, 2000, and entitled HIGH PRECISION DELAY MEASUREMENT CIRCUIT;

Serial No. 60/179,718, filed Feb. 2, 2000, and entitled LIMITED SWING DRIVER CIRCUIT;

Serial No. 60/179,765, filed Feb. 2, 2000, and entitled SINGLE-ENDED SENSE AMPLIFIER WITH SAMPLE-AND-HOLD REFERENCE;

Serial No. 60/179,768, filed Feb. 2, 2000, and entitled SENSE AMPLIFIER WITH OFFSET CANCELLATION AND CHARGE-SHARE LIMITED SWING DRIVERS; and Serial No. 60/179,865, filed Feb. 2, 2000, and entitled MEMORY ARCHITECTURE WITH SINGLE PORT CELL AND DUAL PORT (READ AND WRITE) FUNCTIONALITY.

The following related patent applications, assigned to the same assignee hereof and filed on even date herewith in the names of the same inventors as the present application, disclose related subject matter, with the subject of each being incorporated by reference herein in its entirety:

Memory Module with Hierarchical Functionality, U.S. Ser. No. 09/775,477; High Precision Delay Measurement U.S. Ser. No. 09/776,262, now U.S. Pat. No. 6,603,712; Single-Ended Sense Amplifier with Sample-and-Hold Reference, U.S. No. 6,492,844, Limited Switch Driver Circuit, U.S. Ser. No. 09/775,220, now U.S. Pat No. 6,492,844; Fast Decoder with Asynchronous Reset with Row Redundancy, U.S. Ser. No. 09/775,476; Diffusion Replica Delay Circuit, U.S. Ser. No. 09/776,029; Sense Amplifier with Offset Cancellation and Charge-Share Limited Swing Drivers, U.S. Ser. No. 09/775,475; Memory Architecture with Single-Port Cell and Dual-Port (Read and Write) Functionality, U.S. Ser. No. 09/775,701; Memory Redundancy Implementation, U.S. Ser. No. 09/776,263; A Circuit Technique for High Speed Low Power Data Transfer Bus, U.S. Ser. No. 09/776,028, now U.S. Pat. No. 6,417,697.

BACKGROUND OF THE INVENTION

1. Field of the Invention

The present invention relates to memory devices, in particular, semiconductor memory devices, and most particularly, scalable, power-efficient semiconductor memory devices.

2. Background of the Art

Memory structures have become integral parts of modern VLSI systems, including digital signal processing systems. Although it typically is desirable to incorporate as many memory cells as possible into a given area, memory cell density is usually constrained by other design factors such as layout efficiency, performance, power requirements, and noise sensitivity.

In view of the trends toward compact, high-performance, high-bandwidth integrated computer networks, portable computing, and mobile communications, the aforementioned constraints can impose severe limitations upon memory structure designs, which traditional memory system and subcomponent implementations may fail to obviate.

One type of basic storage element is the static random access memory (SRAM), which can retain its memory state without the need for refreshing as long as power is applied to the cell. In an SRAM device, the memory state II usually stored as a voltage differential within a bistable functional element, such as an inverter loop. A SRAM cell is more complex than a counterpart dynamic RAM (DRAM) cell, requiring a greater number of constituent elements, preferably transistors. Accordingly, SRAM devices commonly consume more power and dissipate more heat than a DRAM of comparable memory density, thus efficient; lower-power SRAM device designs are particularly suitable for VLSI systems having need for high-density SRAM components, providing those memory components observe the often strict overall design constraints of the particular VLSI system. Furthermore, the SRAM subsystems of many VLSI systems frequently are integrated relative to particular design implementations, with specific adaptions of the SRAM subsystem limiting, or even precluding, the scalability of the SRAM subsystem design. As a result SRAM memory subsystem designs, even those considered to be "scalable", often fail to meet design limitations once these memory subsystem designs are scaled-up for use in a VLSI system with need for a greater memory cell population and/or density.

There is a need for an efficient, scalable, high-performance, low-power memory structure that allows a system designer to create a SRAM memory subsystem that satisfies strict constraints for device area, power, performance, noise sensitivity, and the like. Moreover, there is a need for a high speed low power data transfer bus.

SUMMARY OF THE INVENTION

The present invention satisfies the above needs by providing a high speed low power data transfer bus circuit that reduces bus power consumption by imposing a limited, controlled voltage swing on the associated data bus. In one embodiment of the present invention, the controlled voltage swing data bus circuit, an inverter is coupled with a pass transistor, preferably pMOS, and a discharge transistor, preferably nMOS, and the combination is coupled with a data bus. The discharge transistor is preferably programmed to provide a first preselected bus operational characteristic by controlling the rate and extent of voltage decay on the data bus, which can occur when the pass transistor is ON, coupling the discharge transistor through to the data bus. The pass transistor also may be programmed to enhance the control of a bus operational characteristic. In another embodiment of the invention herein, multiple discharge transistors, again, preferably nMOS, can be coupled to the data bus via the pass transistor. In this case, it is preferred that each of the discharge transistors be selectively programmed to provide additional preselected bus operational characteristics by selectably controlling the rate and extent of voltage decay on the data bus. Advantageously, by employing multiple, programmable discharge transistors, multiple, distinct logic levels can be selectably imposed on the data bus. In addition, the availability of multilevel logic permits transferring encoded data to the data bus. Concurrently with effecting a reduction in power consumption, limited voltage swings on the data bus tends to increase the speed of the bus. Furthermore, multilevel logic signal can transmit information with fewer signal lines, relative to standard bi-level logic signals.

In another embodiment of the invention herein, a bidirectional high speed low power data transfer bus circuit couples two data busses while imposing a limited, controlled voltage swing during the transfer. Again, power consumption is reduced even while increasing the speed of the bus. One preferred embodiment of the bidirectional data transfer bus couples a first data bus and a second data bus with cross-linked inverters. Interposed between each of the inverters, and its associated bus, is a respective pass transistor, preferably pMOS, with the node between the pass transistor and the inverter forming the input node for the respective bus. Also, coupled between each input node and ground, is a signal discharge transistor, preferably nMOS, which facilitates data transfer between the buses.

Furthermore, it is desirable to couple each of the inverters with a clocked charge/discharge circuit, preferably using a common clock signal, which charge/discharge circuit can precharge/discharge the input nodes, depending upon the state of the clock and the data on the associated bus. While it is preferred to program the signal discharge transistors to provide preselected bus operational characteristics, including for example, rate of voltage decay on the associated bus, additional programmed signal discharge transistors may be included in the bidirectional circuit to effect multilevel logic. The data transfer bus circuits of the present invention can be used to couple a sense amplifier or a wordline decoder, including for example, a global sense amplifier, a local sense amplifier, a global wordline decoder, and a local wordline decoder, to a data bus.

The present invention will be more fully understood from the following detailed description of the embodiments thereof, taken together with the following drawings.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE EMBODIMENTS

As will be understood by one having skill in the art, most VLSI systems, including communications systems and DSP devices contain VLSI memory subsystems. Modern applications of VLSI memory subsystems almost invariably demand high efficiency, high performance implementations that magnify the design tradeoff between layout efficient, speed, power consumption, scalability, design tolerances, and the like. The present invention ameliorates these tradeoffs using a novel hierarchical architecture. The memory module of the present invention also can employ one or more novel components which further add to the memory modules efficiency and robustness.

Hereafter, but solely for the purposes of exposition, it will be useful to describe the various aspects and embodiments of the invention herein in the context of an SRAM memory structure, using CMOS SRAM memory cells. However, it will be appreciated by those skilled in the art the present invention is not limited to CMOS-based processes and that, mutatis mutandi, these aspects and embodiments may be used in categories of memory products other than SRAM, including without limitation, DRAM, ROM, PLA, and the like, whether embedded within a VLSI system, or a stand alone memory device.

Exemplary Sram Module and Storage Cell

Figure 1:
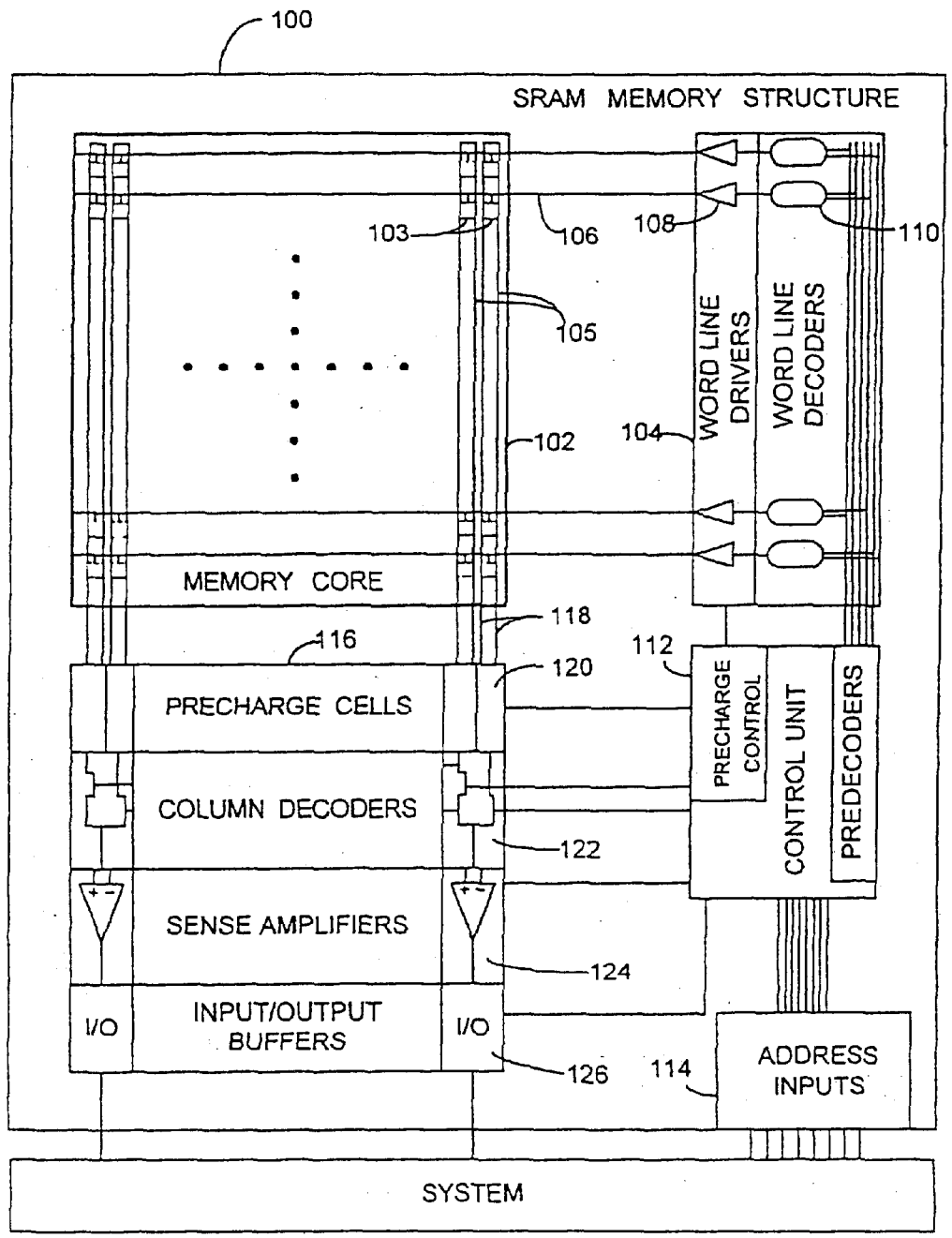
FIG. 1 is a block diagram of an exemplary static random access memory (SRAM) architecture.

FIG. 1 is a functional block diagram of SRAM memory structure 100 that illustrates the basic features of most SRAM subsystems. Module 100 includes memory core 102, word line controller 104, precharge controller 112, memory address inputs 114, and bitline controller 116. Memory core 102 is composed of a two-dimensional array of K-bits of memory cells 103, which is arranged to have C columns and R rows of bit storage locations, where K=[C×R]. The most common configuration of memory core 102 uses single word line 106 to connect cells 103 onto paired differential bitlines 118. In general, core 102 is arranged as an array of $2^P$ word lines, based on a set of P memory address input lines 114 i.e., $R=2^P$. Thus, the p-bit address is decoded by row address decoder 110 and column address decoder 122. Access to a given memory cell 103 within such a single-core memory is accomplished by activating the column 105 and the row 106 corresponding to cell 103. Column 105 is activated by selecting, and switching, all bitlines in the particular column corresponding to cell 103.

The particular row to be accessed is chosen by selective activation of row address decoder 110, which usually corresponds uniquely with a given row, or word line, spanning all cells 103 on the particular row. Also, word driver 108 can drive selected word line 106 such that selected memory cell 103 can be written into or read out, on a particular pair of bitlines 118, according to the bit address supplied to memory address inputs 114.

Bitline controller 116 can include precharge cells 120, column multiplexers 122, sense amplifiers 124, and input/output buffers 126. Because differential read/write schemes are typically used for memory cells, it is desirable that bitlines be placed in a well-defined state before being accessed. Precharge cells 120 can be used to set up the state of bitlines 118, through a PRECHARGE cycle, according to a predefined precharging scheme. In a static precharging scheme, precharge cells 120 can be left continuously on. While often simple to implement, static precharging can add a substantial power burden to active device operation. Dynamic precharging schemes can use clocked precharge cells 120 to charge the bitlines and, thus, can reduce the power budget of structure 100. In addition to establishing a defined state on bitlines 118, precharging cells 120 can also be used to effect equalization of differential voltages on bitlines 118 prior to a read operation. Sense amplifiers 124 allow the size of memory cell 103 to be reduced by sensing the differential voltage on bitline 118, which is indicative of its state, and translating that differential voltage into a logic-lever signal.

In general a READ operation is performed by enabling row decoder 110, which selects a particular row. The charge on one bitlines 118 from each pair of bitlines on each column will discharge through the enabled memory cell 103, representing the state of the active cells 103 on that column 105. Column decoder 122 will enable only one of the columns, and will connect bitlines 118 to input/output buffer 126. Sense amplifiers 124 provide the driving capability to source current to input/output buffer 126. When sense amplifier 124 is enabled, the unbalanced bitlines 118 will cause the balanced sense amplifier to trip toward the state of the bitlines, and data 125 will be output by buffer 126.

A WRITE operation is performed by applying data 125 to I/O buffers 126. Prior to the WRITE operation, bitlines 118 are precharged by precharge cells 120 to a predetermined value. The application of input data 125 to I/O buffers 126 tend to discharge the precharge voltage on one of the bitlines 118, leaving one bitline logic HIGH and one bitline logic LOW. Column decoder 122 selects a particular column 105 connecting bitlines 118 to I/O buffers 126, thereby discharging one of the bitlines 118. The row decoder 110 selects a particular row, and the information on bitlines 118 will be written on cell 103 at the intersection of column 105 and row 106. At the beginning of a typical internal timing cycle, precharging is disabled, and is not enabled again until the entire operation is completed. Column decoder 122 and row decoder 110 are then activated, followed by the activation of sense amplifier 124. At the conclusion of a READ or a WRITE operation, sense amplifier 124 is deactivated. This is followed by disabling decoders 110, 122, at which time precharge cells 120 become active again during a subsequent PRECHARGE cycle. In general, keeping sense amplifier 124 activated during the entire READ/WRITE operation leads to excessive device power consumption, because sense amplifier 124 needs to be active only for the actual time required to sense the state of memory cell 103.

Figure 2:
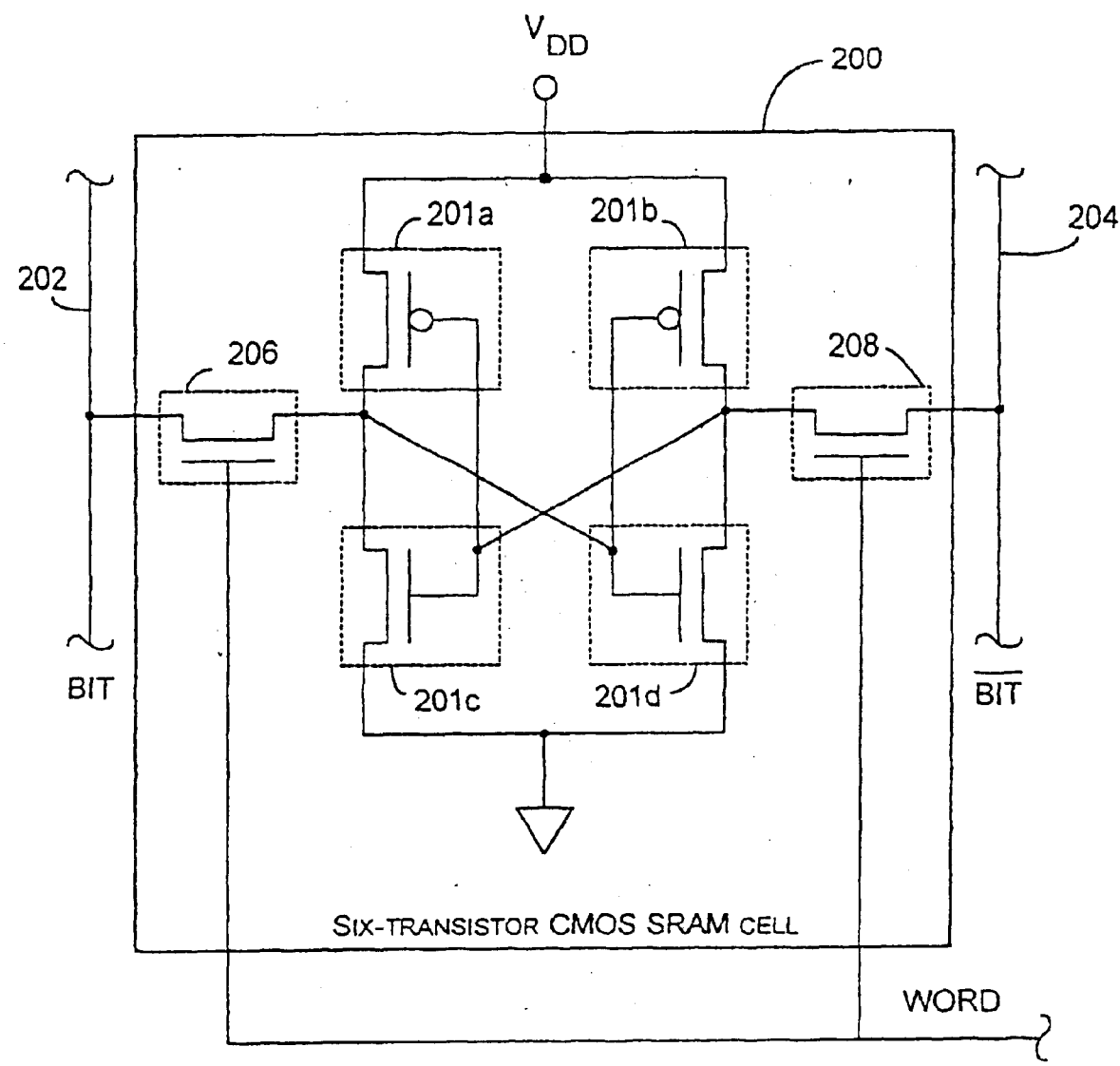
FIG. 2 is a general circuit schematic of an exemplary six-transistor CMOS SRAM memory cell.

FIG. 2 illustrates one implementation of memory cell 103 in FIG. 1, in the form of six-transistor CMOS cell 200. Transistor cell 200 is one type of transistor which also may be used in embodiments of the present invention. SRAM cell 200 can be in one of three possible states: (1) the STABLE state, in which cell 200 holds a signal value corresponding to a logic "1" or logic "0"; (2) a READ operation state; or (3) a WRITE operation state. In the STABLE state, memory cell 200 is effectively disconnected from the memory core (e.g., core 102 in FIG. 1). Bitlines 202, 204 are precharged HIGH (logic "1") before any operation (READ or WRITE) can take place. Row select transistors 206, 208 are turned off during precharge. Precharge power is supplied by precharge cells (not shown) coupled with the bitlines 202, 204, similar to precharge cells 120 in FIG. 1. A READ operation is initiated by performing a PRECHARGE cycle, precharging bitlines 202, 204 to logic HIGH, and activating word line 205 using row select transistors 206, 208. One of the bitlines 202, 204 discharges through bit cell 200, and a differential voltage is setup between the bitlines 202, 204. This voltage is sensed and amplified to logic levels. A WRITE operation to cell 200 is carried out after another PRECHARGE cycle, by driving bitlines 202, 204 to the required state, and activating word line 205. CMOS is a desirable technology because the supply current drawn by such an SRAM cell typically is limited to the leakage current of transistors 201a–d while in the STABLE state.

As memory cell density increases, and as memory components are further integrated into more complex systems, it becomes imperative to provide memory architectures that are robust, reliable, fast, and area- and power-efficient. Single-core architectures, similar to those illustrated in FIG. 1, are increasingly unable to satisfy the power, speed, area and robustness constraints for a given high-performance memory application. Therefore, it is desirable to minimize power consumption, increase device speed, and improve device reliability and robustness, and numerous approaches have been developed to those ends. The advantages of the present invention may be better appreciated within the following context of some of these approaches, particularly as they relate to power reduction and speed improvement, and to redundancy and robustness.

Power Reduction and Speed Improvement

In reference to FIG. 1, the content of memory cell 103 of memory block 100 is detected in sense amplifier 102, using a differential signal between bitlines 104, 106. However, this architecture is not scalable. Also, as memory block 100 is made larger, there are practical limitations to the ability of sense amplifier 102 to receive an adequate signal in a timely fashion at bitlines 104, 106. Increasing the length of bitlines 104, 106, increases the associated bitline capacitance and, thus, increases the time needed for a signal to develop on bitlines 104, 106. More power must be supplied to lines 104, 106 to overcome the additional capacitance. Also, under the architectures of the existing art, it takes more time to precharge longer bitlines, thereby reducing the effective device speed. Similarly, writing to longer bitlines 104, 106, as found in the existing art, requires more extensive precharging, thereby increasing the power demands of the circuit, and further reducing the effective device speed.

In general, reduced power consumption in memory devices such as structure 100 in FIG. 1 can be accomplished by, for example, reducing total switched capacitance, and minimizing voltage swings. The advantages of the power reduction aspects of certain embodiments of the present invention can further be appreciated within the context of switched capacitance reduction and voltage swing limitation.

Switched Capacitance Reduction

As the bit density of memory structures increases, it has been observed that single-core memory structures can have unacceptably large switching capacitances associated with each memory access. Access to any bit location within such a single-core memory necessitates enabling the entire row, or word line, in which the datum is stored, and switching all bitlines in the structure. Therefore, it is desirable to design high-performance memory structures to reduce the total switched capacitance during any given access.

Two well-known approaches for reducing total switched capacitance during a memory structure access include dividing a single-core memory structure into a banked memory structure, and employing divided word line structures. In the former approach, it is necessary to activate only the particular memory bank associated with the memory cell of interest. In the latter approach, total switched capacitance is reduced by localizing word line activation to the greatest practicable extent.

Divided or Banked Memory Core

One approach to reducing switching capacitances is to divide the memory core into separately switchable banks of memory cells. Typically, the total switched capacitance during a given memory access for banked memory cores is inversely proportional to the number of banks employed. By judiciously selecting the number and placement of bank units within a given memory core design, as well as the type of decoding used, the total switching capacitance, and thus the overall power consumed by the memory core, can be greatly reduced. A banked design also may realize a higher product yield, because the memory banks can be arranged such that a defective bank is rendered inoperable and inaccessible, while the remaining operational banks of the memory core can be packed into a lower-capacity product.

However, banked designs may not be appropriate for certain applications. Divided memory cores demand additional decoding circuitry to permit selective access to individual banks, and incur a delay as a result. Also, many banked designs employ memory segments that are merely scaled-down versions of traditional monolithic core memory designs, with each segment having dedicated control, precharging, decoding, sensing, and driving circuitry. These circuits tend to consume much more power in both standby and operational modes, than do their associated memory cells. Such banked structures may be simple to design, but the additional complexity and power consumption thus can reduce overall memory component performance.

By their very nature, banked designs are not suitable for scaling-up to accommodate large design requirements. Also, traditional banked designs may not be readily conformable to applications requiring a memory core configuration that is substantially different from the underlying memory bank architecture (e.g., a memory structure needing relatively few rows of very long bit-length word lengths). Rather than resort to a top-down division of the basic memory structure using banked memory designs, preferred embodiments of the present invention provide a hierarchical memory structure that is synthesized using a bottom-up approach, by hierarchically coupling basic memory modules with localized decision-making features that synergistically cooperate to dramatically reduce the overall power needs, and improve the operating speed, of the structure. At a minimum, such a basic hierarchical module can include localized bitline sensing.

Divided Word Line

Often, the bit-width of a memory component is sized to accommodate a particular word length. As the word length for a particular design increases, so do the associated word line delays, switched capacitance, power consumption, and the like. To accommodate very long word lines, it may be desirable to divide core-spanning global word lines into local word lines, each consisting of smaller groups of adjacent, word-oriented memory cells. Each local group employs local decoding and driving components to produce the local word line signals when the global word line, to which it is coupled, is activated. In long word length applications, the additional overhead incurred by divided word lines can be offset by reduced word line delays, power consumption and so forth. However, the added overhead imposed by existing divided word line schemes may make it unsuitable for many implementations. As before, rather than resorting to the traditional top-down division of word lines, certain preferred embodiment of the invention herein include providing a local word line to the aforementioned basic memory module, which further enhances the local decision making features of the module. As before, by using a bottom-up approach to hierarchically couple basic memory modules, here with the added localized decision-making features of local word lines according to the present invention, additional synergies are realized, which further reduce overall power consumption and signal propagation times.

Voltage-Swing Reduction Techniques

Power reduction also can be achieved by reducing the voltage swings experienced throughout the structure. By limiting voltage swings, it is possible to reduce the amount of power dissipated as the voltage at a node or on a line decays during a particular event or operation, as well as to reduce the amount of power required to return the various decayed voltages to the desired state after the particular event or operation, or prior to the next access. Two techniques to this end include using pulsed word lines and sense amplifier voltage swing reduction.

Pulsed Word Lines

By enabling a word line just long enough to correctly detect the differential voltage across a selected memory cell, it is possible to reduce the bitline voltage discharge corresponding to a READ operation on the selected cell. In some designs, by applying a pulsed signal to the associated word line over a chosen interval, a sense amplifier is activated only during that interval, thereby reducing the duration of the bitline voltage decay. These designs typically use some form of pulse generator that produces a fixed-duration pulse. If the duration of the pulse is targeted to satisfy worst-case timing scenarios, the additional margin will result in unnecessary bitline current draw during nominal operations. Therefore, it is desirable to employ a self-timed, self-limiting word line device that is responsive to the actual duration of a given READ operation on a selected cell, and that substantially limits word line activation to that duration. Furthermore, where a sense amplifier can successfully complete a READ operation in less than a memory system clock cycle, it also may be desirable that the pulse width activation be asynchronous, relative to the memory system clock. Certain aspects of the present invention provide a pulsed word line signal, for example, using a cooperative interaction between global and local word line decoders.

Sense Amplifier Voltage Swing Reduction

In order to make large memory arrays, it is most desirable to keep the size of an individual memory cell to a minimum. As a result, individual memory cells generally are incapable of supplying driving current to associated input/output bitlines. Sense amplifiers typically are used to detect the value of the datum stored in a particular memory cell and to provide the current needed to drive the I/O lines. In sense amplifier design, there typically is a trade-off between power and speed, with faster response times usually dictating greater power requirements. Faster sense amplifiers can also tend to be physically larger, relative to low speed, low power devices. Furthermore, the analog nature of sense amplifiers can result in their consuming an appreciable fraction of the total power. Although one way to improve the responsiveness of a sense amplifier is to use a more sensitive sense amplifier, any gained benefits are offset by the concomitant circuit complexity which nevertheless suffers from increased noise sensitivity. It is desirable, then, to limit bitline voltage swings and to reduce the power consumed by the sense amplifier.

In one typical design, the sense amplifier detects the small differential signals across a memory cell, which are in an unbalanced state representative of datum value stored in the cell, and amplifies the resulting signal to logic level. Prior to a READ operation, the bitlines associated with a particular memory column are precharged to a chosen value. When a specific memory cell is enabled, a row decoder selects the particular row in which the memory cell is located, and an associated column decoder selects a sense amplifier associated with the particular column. The charge on one of those bitlines is discharged through the enabled memory cell, in a manner corresponding to the value of the datum stored in the memory cell. This produces an imbalance between the signals on the paired bitlines, and causing a bitline voltage swing. When enabled, the sense amplifier detects the unbalanced signal and, in response, the usually-balanced sense amplifier state changes to a state representative of the value of the datum. This state detection and response occurs within a finite period, during which a specific amount of power is dissipated. The longer it takes to detect the unbalanced signal, the greater the voltage decay on the precharged bitlines, and the more power dissipated during the READ operation. Any power that is dissipated beyond the actual time necessary for sensing the memory cell state, is truly wasted power. In traditional SRAM designs, the sense amplifiers that operate during a particular READ operation, remain active during nearly the entire read cycle. However, this approach unnecessarily dissipates substantial amounts of power, considering that a sense amplifier needs to be active just long enough to correctly detect the differential voltage across a selected memory cell, indicating the stored memory state.

There are two general approaches to reducing power in sense amplifiers. First, sense amplifier current can be limited by using sense amplifiers that automatically shut off once the sense operation has completed. One sense amplifier design to this end is a self-latching sense amplifier, which turns off as soon as the sense amplifier indicates the sensed datum state. Second, sense amplifier currents can be limited by constraining the activation of the sense amplifier to precisely the period required. This approach can be realized through the use of a dummy column circuit, complete with bit cells, sense amplifier, and support circuitry. By mimicking the operation of a functional column, the dummy circuit can provide to a sense amplifier timing circuit an approximation of the activation period characteristic of the functional sense amplifiers in the memory system. Although the dummy circuit approximation can be quite satisfactory, there is an underlying assumption that all functional sense amplifiers have completed the sensing operation by the time the dummy circuit completes the its operation. In that regard, use of a dummy circuit can be similar to enabling the sense amplifiers with a fixed-duration pulsed signal. Aspects of the present invention provide circuitry and sense amplifiers which limit voltage swings, and which improve the sensitivity and robustness of sense amplifier operation. For example, compact, power-conserving sense amplifiers having increased immunity to noise, as well as to intrinsic and operational offsets, are provided. In the context of the present invention, such sense amplifiers can be realized at the local module tier, as well as throughout the higher tiers of a hierarchical memory structure, according to the present invention.

Redundancy

Memory designers typically balance power and device area against speed. High-performance memory components place a severe strain on the power and area budgets of associated systems particularly where such components are embedded within a VLSI system, such as a digital signal processing system. Therefore, it is highly desirable to provide memory subsystems that are fast, yet power-and area-efficient. Highly integrated, high performance components require complex fabrication and manufacturing processes. These processes experience unavoidable parameter variations which can impose physical defects upon the units being produced, or can exploit design vulnerabilities to the extent of rendering the affected units unusable, or substandard.

In a memory structure, redundancy can be important, for example, because a fabrication flaw, or operational failure, of even a single bit cell may result in the failure of the system relying upon the memory. Likewise, process invariant features may be needed to insure that the internal operations of the structure conform to precise timing and parametric specifications. Lacking redundancy and process invariant features, the actual manufacturing yield for a particular memory structure can be unacceptably low. Low-yield memory structures are particularly unacceptable when embedded within more complex systems, which inherently have more fabrication and manufacturing vulnerabilities. A higher manufacturing yield translates into a lower per-unit cost and robust design translates into reliable products having lower operational costs. Thus, it is also highly desirable to design components having redundancy and process invariant features wherever possible.

Redundancy devices and techniques constitute other certain preferred aspects of the invention herein which, alone or together, enhance the functionality of the hierarchical memory structure. The aforementioned redundancy aspects of the present invention can render the hierarchical memory structure less susceptible to incapacitation by defects during fabrication or during operation, advantageously providing a memory product that is at once more manufacturable and cost-efficient, and operationally more robust. Redundancy within a hierarchical memory module can be realized by adding one or more redundant rows, columns, or both, to the basic module structure. In one aspect of the present invention a decoder enabling row redundancy is provided. Moreover, a memory structure composed of hierarchical memory modules can employ one or more redundant modules for mapping to failed memory circuits. A redundant module can provide a one-for-one replacement of a failed module, or it can provide one or more memory cell circuits to one or more primary memory modules.

Memory Module With Hierarchical Functionality

The modular, hierarchical memory architecture according to the invention herein provides a compact, robust, power-efficient, high-performance memory system having, advantageously, a flexible and extensively scalable architecture. The hierarchical memory structure is composed of fundamental memory modules which can be cooperatively coupled, and arranged in multiple hierarchical tiers, to devise a composite memory product having arbitrary column depth or row length. This bottom-up modular approach localizes timing considerations, decision making, and power consumption to the particular unit(s) in which the desired data is stored.

Within a defined design hierarchy, the fundamental memory modules can be grouped to form a larger memory block, that itself can be coupled with similar memory structures to form still larger memory blocks. In turn, these larger structures can be arranged to create a complex structure at the highest tier of the hierarchy. In hierarchical sensing, it is desired to provide two or more tiers of bit sensing, thereby decreasing the read and write time of the device, i.e., increasing effective device speed, while reducing overall device power requirements. In a hierarchical design, switching and memory cell power consumption during a read/write operation are localized to the immediate vicinity of the memory cells being evaluated or written, i.e., those memory cells in selected memory modules, with the exception of a limited number of global word line selectors and sense amplifiers, and support circuitry. The majority of modules that do not contain the memory cells being evaluated or written generally remain inactive.

Preferred embodiments of the present invention provide a hierarchical memory module using local bitline sensing, local word line decoding, or both, which intrinsically reduces overall power consumption and signal propagation, and increases overall speed, as well as design flexibility and scalability. Aspects of the present invention contemplate apparatus and methods which further limit the overall power dissipation of the hierarchical memory structure, while minimizing the impact of a multi-tier hierarchy. Certain aspects of the present invention are directed to mitigate functional vulnerabilities that may develop from variations in operational parameters, or that related to the fabrication process. In addition, devices and techniques are disclosed which advantageously ameliorate system performance degradation resulting from temporal inefficiencies, including, without limitation, a high-precision delay measurement circuit, a diffusion delay replication circuit and associated dummy devices. In another aspect of the present invention, an asynchronously resettable decoder is provided that reduces the bitline voltage discharge, corresponding, for example, to a READ operation on the selected cell, by limiting word-line activation to the actual time required for the sense amplifier to correctly detect the differential voltage across a selected memory cell.

Hierarchical Memory Modules

In prior art memory designs, such as the aforementioned banked designs, large logical memory blocks are divided into smaller, physical modules, each having the attendant overhead of an entire block of memory including predecoders, sense amplifiers, multiplexers, and the like. In the aggregate, such memory blocks would behave as an individual memory block. However, using the present invention, memory blocks of comparable, or much larger, size can be provided by coupling hierarchical functional modules into larger physical memory blocks of arbitrary number of words and word length. For example, existing designs which aggregate smaller memory blocks into a single logical block usually require the replication of the predecoders, sense amplifiers, and other overhead circuitry that would be associated with a single memory block. According to the present invention, this replication is unnecessary, and undesirable. One embodiment of the invention comprehends local bitline sensing, in which a limited number of memory cells are coupled with a single local sense amplifier, thereby forming a basic memory module. Similar memory modules are grouped and arranged to output the local sense amplifier signal to the global sense amplifier signal. Thus, the bitlines associated with the memory cells are not directly coupled with a global sense amplifier, mitigating the signal propagation delay and power consumption typically associated with global bitline sensing. In this approach, the local bitline sense amplifier quickly and economically sense the state of a selected memory cell and report the state to the global sense amplifier. In another embodiment of the invention herein, the delays and power consumption of global word line decoding are mitigated by providing a memory module, composed of a limited number of memory cells, having local word line decoding. Similar to the local bitline sensing approach, a single global word line decoder can be coupled with the respective local word line decoders of multiple modules. When the global decoder is activated with an address, only the local word line decoder associated with the desired memory cell responds, and activates the memory cell. This aspect, too, is particularly power-conservative and fast, because the loading on the global line is limited to the associated local word line decoders, and the global word line signal need be present only as long as required to trigger the relevant local word line. In yet another embodiment of the present invention, a hierarchical memory module employing both local bitline sensing and local word line decoding is provided, which realizes the advantages of both approaches. Each of the above embodiments are discussed forthwith.

Local Bitline Sensing

Figure 3:
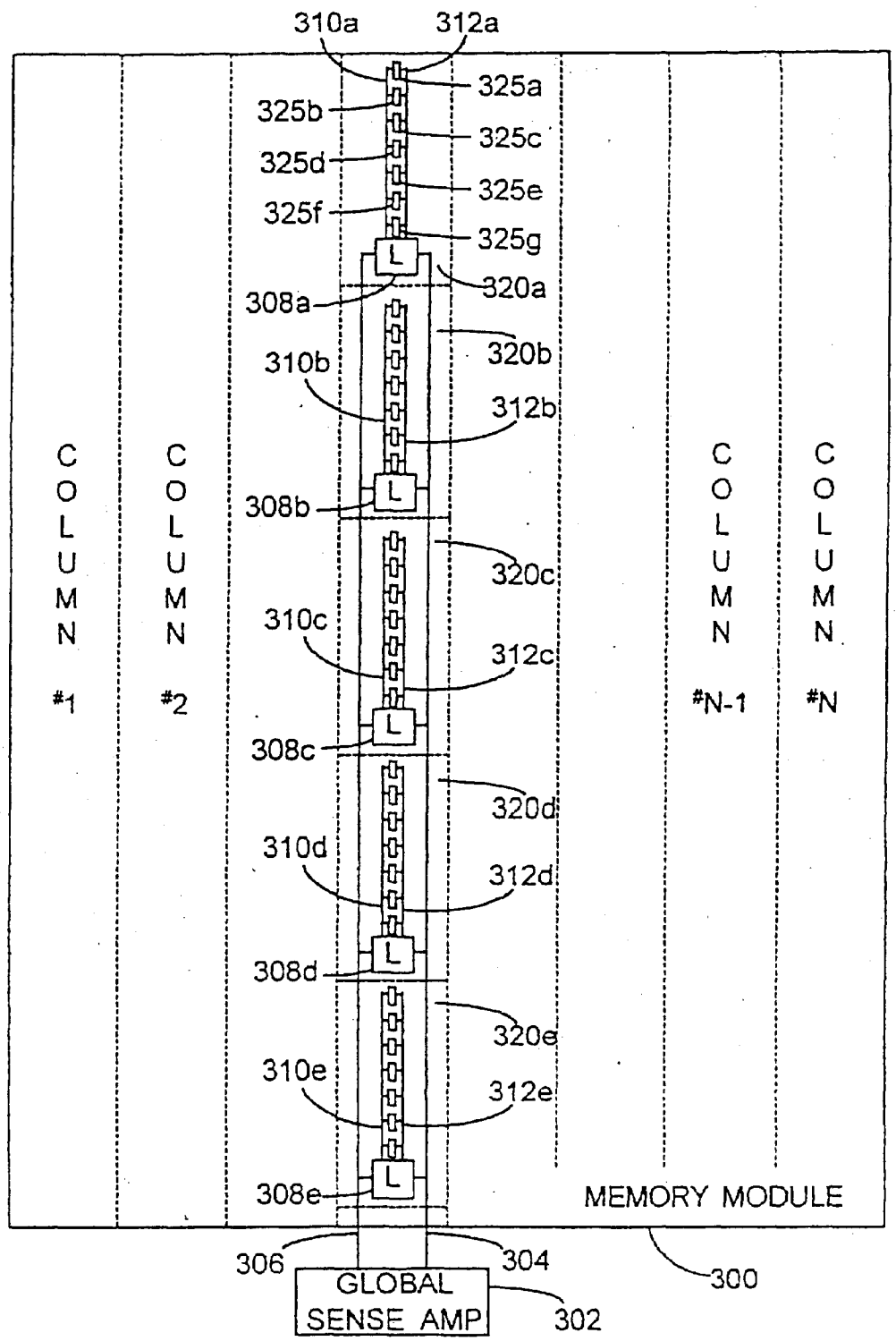
FIG. 3 is a block diagram of an embodiment of a hierarchical memory module using local bitline sensing, according to the present invention.

FIG. 3 illustrates a memory block 300 formed by coupling multiple cooperating constituent modules 320a–e, with each of the modules 320a–e having a respective local sense amplifier 308a–e. Each module is composed of a predefined number of memory cells 325a–g, which are coupled with one of the respective local sense amplifiers 308a–e. Each local sense amplifiers 308a–e is coupled with global sense amplifier 302 via bitlines 304, 306. Because each of local sense amplifiers 308a–e sense only the local bitlines 310a–e, 312a–e, of the respective memory modules 320a–e, the amount of time and power necessary to precharge local bitlines 310a–e and 312a–e are substantially reduced. Only when local sense amplifier 308a–e senses a signal on respective local lines 310a–e and 312a–e, does it provide a signal to global sense amplifier 302. This architecture adds flexibility and scalability to a memory architecture design because the memory size can be increased by adding locally-sensed memory modules such as 320a–e.

Increasing the number of local sense amplifiers 308a–e attached to global bitlines 304, 306, does not significantly increase the loading upon the global bitlines, or increase the power consumption in global bitlines 304, 306 because signal development and precharging occur only in the local sense amplifier 308a–e, proximate to the signal found in the memory cells 325a–g within corresponding memory module 320a–e.

In preferred embodiments of the invention herein, it is desirable to have each module be self-timed. That is, each memory module 320a–e can have internal circuitry that senses and establishes a sufficient period for local sensing to occur. Such self-timing circuitry is well-known in the art. In single-core designs, or even banked designs, self-timing memory cores may be unsuitable for high-performance operation, because the timing tends to be dependent upon the slowest of many components in the structure, and because the signal propagation times in such large structures can be significant. The implementation of self-timing in these larger structures can be adversely affected by variations in fabrication and manufacturing processes, which can substantially impact the operational parameters of the memory array and the underlying timing circuit components.

In a hierarchical memory module, self-timing is desirable because the timing paths for each module 320a–e comprehends only a limited number of memory cells 325a–g over a very limited signal path. Each module, in effect, has substantial autonomy in deciding the amount of time required to execute a given PRECHARGE, READ, or WRITE operation. For the most part, the duration of an operation is very brief at the local tier, relative to the access time of the overall structure, so that memory structure 300 composed of hierarchical memory modules 320a–e is not subject to the usual difficulties associated with self-timing, and also is resistant to fabrication and manufacturing process variations.

In general, the cores of localized sense amplifiers 308a–e can be smaller than a typical global sense amplifier 302, because a relatively larger signal develops within a given period on the local sense amplifier bitlines, 310a–e, 312a–e. That is, there is more signal available to drive local sense amplifier 308a–e. In a global-sense-amplifier-only architecture, a greater delay occurs while a signal is developed across the global bitlines, which delay can be decreased at the expense of increased power consumption. Advantageously, local bit sensing implementations can reduce the delay while simultaneously reducing consumed power.

In certain aspects of the invention herein, detailed below, a limited swing driver signal can be sent from the active local sense amplifier to the global sense amplifier. A full swing signal also may be sent, in which case, a very simple digital buffer, may be used. However, if a limited swing signal is used, a more complicated sense amplifier may be needed. For a power constrained application, it may be desirable to share local sense amplifiers among two or more memory modules. Sense amplifier sharing, however, may slightly retard the bit signal development line indirectly because, during the first part of a sensing period, the capacitances of each of the top and the bottom shared memory modules are being discharged. However, this speed decrease can be minimized and is relatively small, when compared to the benefits gained by employing logical sense amplifiers over the existing global-only architectures. Moreover, preferred embodiments of the invention herein can obviate these potentially adverse effects of sense amplifier sharing by substantially isolating the local sense amplifier from associated local bitlines which are not coupled with the memory cell to be sensed.

Figure 4:
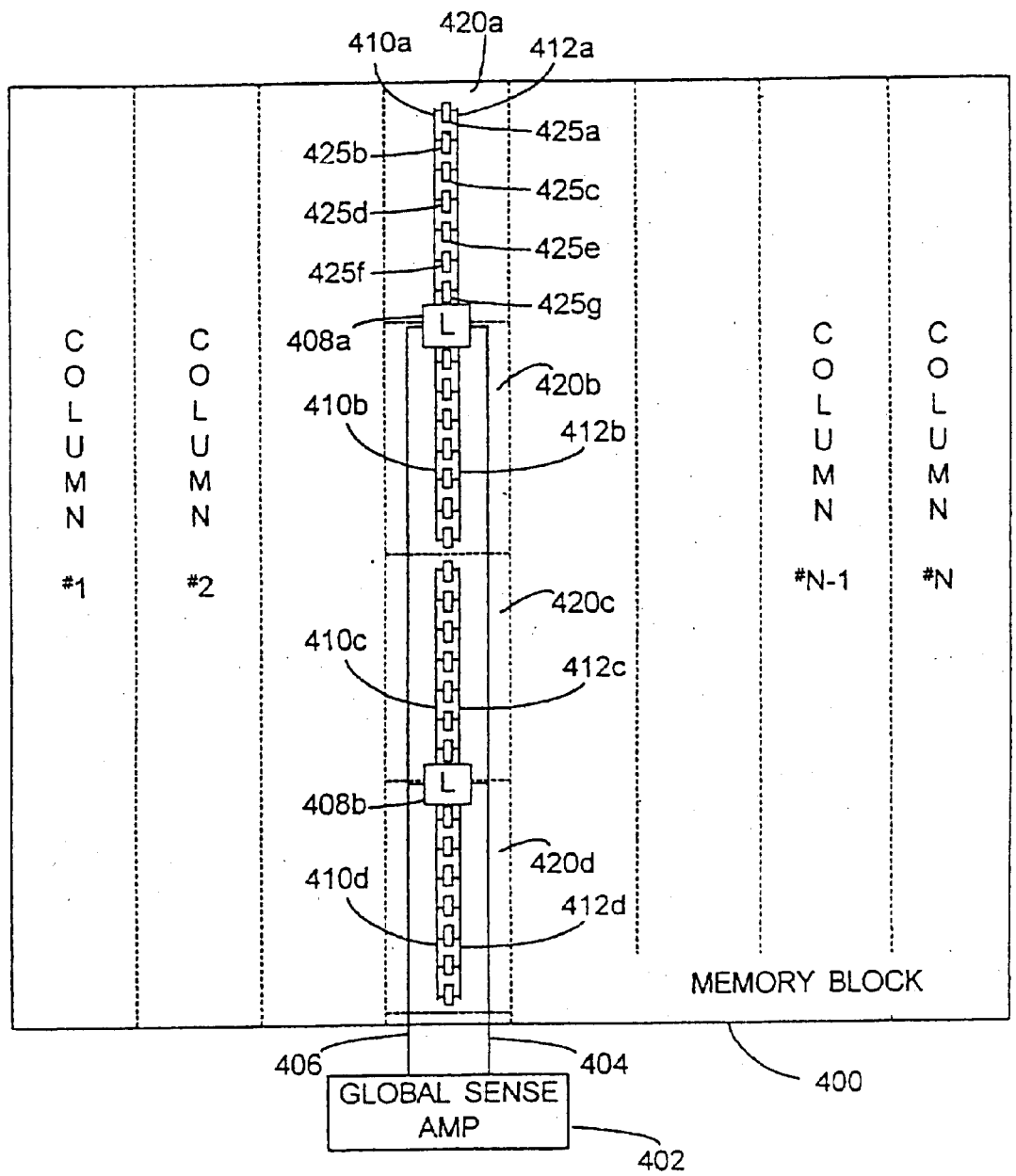
FIG. 4 is a block diagram of an embodiment of a hierarchical memory module using an alternative local bitline sensing structure.

FIG. 4 shows a memory structure 400, which is similar to structure 300 in FIG. 3, by providing local bitline sensing of modules 420a–d. Each memory module 420a–d is composed of a predefined number of memory cells 425a–g. Memory cells 425a–g are coupled with respective local sense amplifier 408a, b via local bitlines 410a–d, 412a–d. Unlike structure 300 in FIG. 3, where each module 320a–e has its own local sense amplifier 308a–e, memory modules 420a–d are paired with a single sense amplifier 408a, b. Similar to FIG. 3, FIG. 4 shows global sense amplifier 402 being coupled with local sense amplifiers 408a, 408b.

Figure 5:
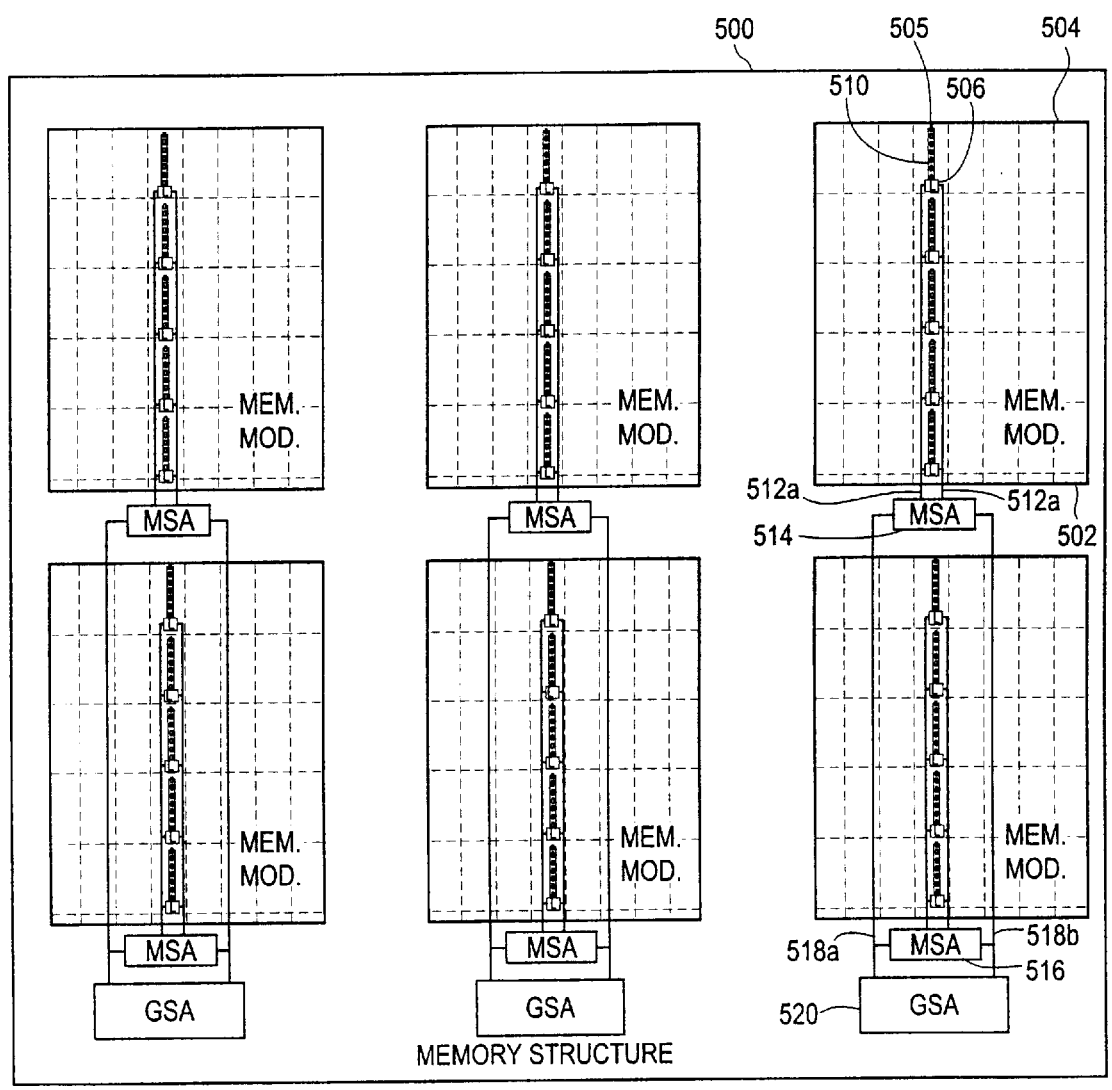
FIG. 5 is a block diagram of an exemplary two-dimensional, two-tier hierarchical memory structure, employing plural local bitline sensing modules of FIG. 3.

FIG. 5 further illustrates that memory structures such as module 300 in FIG. 3 can be coupled such that the overall structure is extended in address size (this is vertically), or in bit length (this is horizontally), or both. The arrayed structure in FIG. 5 also can use modules such as module 400 in FIG. 4. FIG. 5 also illustrates that a composite memory structure 500 using hierarchical memory modules can be truly hierarchical. Memory blocks 502, 503 can be composed of multiple memory modules, such as module 504, which can be modules as described in reference to FIG. 3 and FIG. 4. Each memory block 502, 503 employs two-tier sensing, as previously illustrated. However, in structure 500, memory blocks 502, 503 employ an intermediate tier of bitline sensing, using, for example, midtier sense amplifiers 514, 516. Under the hierarchical memory paradigm, midtier sense amplifiers 514, 516 can be coupled with global sense amplifier 520. Indeed, the hierarchical memory paradigm, in accordance with the present invention, can comprehend a highly-scalable multi-tiered hierarchy, enabling the memory designer to devise memory structures having memory cell densities and configurations that are tailored to the application. Advantageously, this scalability and configurability can be obtained without the attendant delays, and substantially increased power and area consumption of prior art memory architectures.

One of the key factors in designing a faster, power-efficient device is that the capacitance per unit length of the global bitline can be made less than the capacitance of the local bitlines. This is because, using the hierarchical scheme, the capacitance of the global bitline is no longer constrained by the cell design. For example, metal lines can be run on top of the memory device. Also, a multiplexing scheme can be used that increase the pitch of the bitlines, thereby dispersing them, further reducing bitline capacitance. Overall, the distance between the global bitlines can be wider, because the memory cells are not directly connected to the global bitlines. Instead, each cell, e.g. cell 303 in FIG. 3., is connected only to the local sense amplifier, e.g. sense amplifier 308*a–e*.

Local Word Line Decoding

Figure 6:
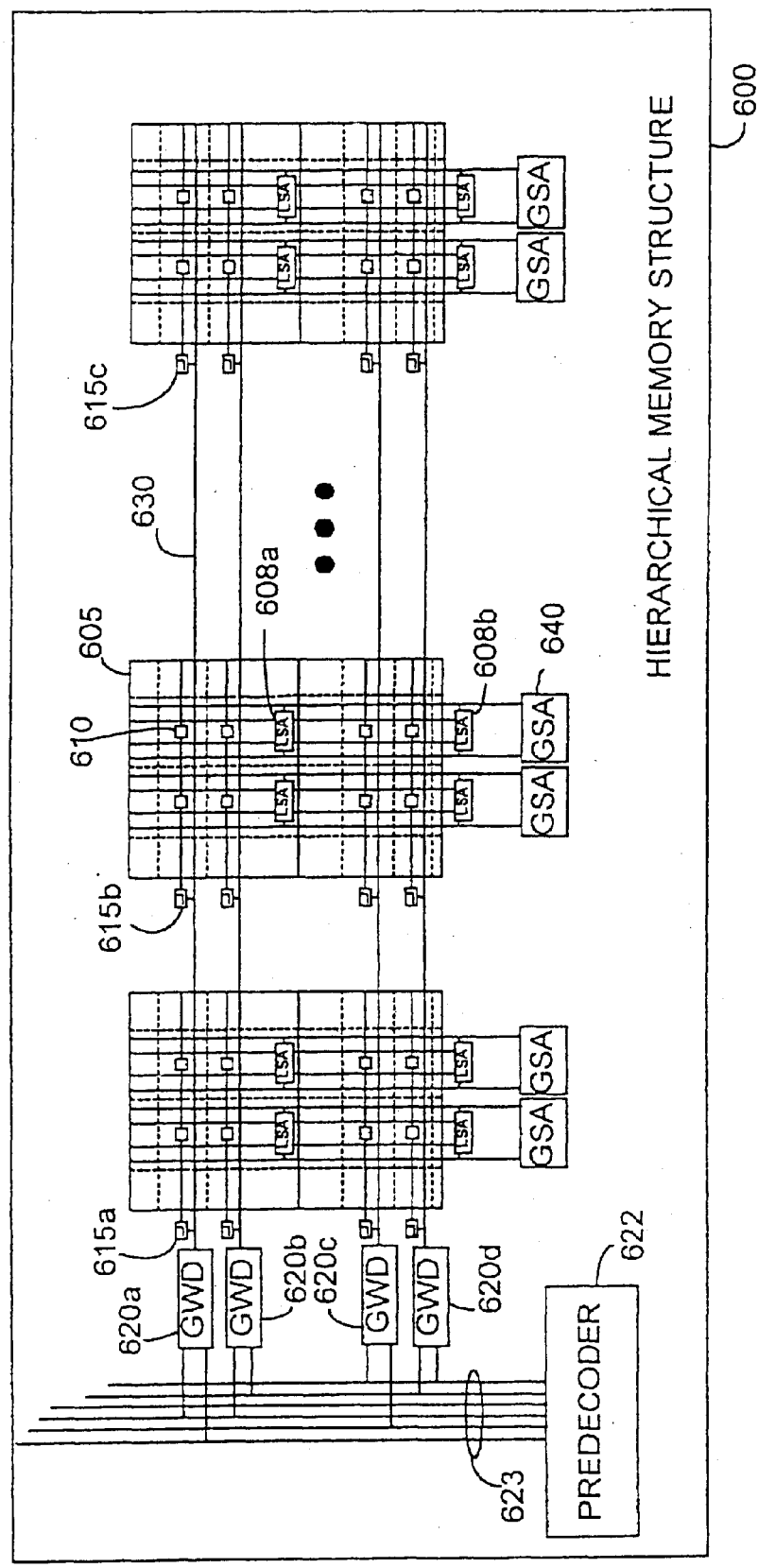
FIG. 6 is a block diagram of an exemplary hierarchical memory structure depicting a memory module employing both local word line decoding and local bitline sensing structures.

FIG. 6 illustrates a hierarchical structure 600 having hierarchical word-line decoding in which each hierarchical memory module 605 is composed of a predefined number of memory cells 610, which are coupled with a particular local word line decoder 615*a–c*. Each local word line decoder 615*a–c* is coupled with a respective global word line decoder 620. Each global word line decoder 620*a–d* is activated when predecoder 622 transmits address information relevant to a particular global word line decoder 620*a–d* via predecoder lines 623. In response, global word line decoder 620*a–d* activates global word line 630 which, in turn, activates a particular local word line decoder 615*a–c*. Local word line decoder 615*a–c* then enables associated memory module 605, so that the particular memory cell 610 of interest can be evaluated. Each of memory modules 605 can be considered to be an independent memory component to the extent that the hierarchical functionality of each of modules 605 relies upon local sensing via local sense amplifiers 608*a–b*, local decoding via local word line decoders 615*a–c*, or both. As with other preferred embodiments of the invention herein, it is desirable to have each module 605 be self-timed. Self-timing can be especially useful when used in conjunction with local word line decoding because a local timing signal from a respective one of memory module 605 can be used to terminate global word line activation, local bitline sensing, or both.

Similar to the scaling illustrated in FIG. 5, multiple memory devices 600 can be arrayed coupled with global bitlines or global decoding word lines, to create a composite memory component of a desired size and configuration. In an embodiment of the present invention, 256 rows of memory are used in each module 605, allowing the memory designer to create a memory block of arbitrary size, having a 256 row granularity. For prior art memory devices, a typical realistic limitation to the number of bits sense per sense amplifier is about 512 bit. Long bit or word lines can present a problem, particularly for a WRITE operations, because the associated driver can be limited by the amount of power it can produce, and the speed at which sufficient charge can be built-up upon signal lines, such as global bitlines 604, 606 in FIG. 6.

Although FIG. 6 shows hierarchical word line decoding used in conjunction with hierarchical bitline operations, hierarchical word-line decoding can be implemented without hierarchical bitline sensing. It is preferred to use both the hierarchical word line decoding, and the hierarchical bitline sensing to obtain the synergistic effects of decreased power and increased speed for the entire device.

Hierarchical Functionality

In typical designs, power intends to increase approximately linearly with the size of the memory. However, according to the present invention, as illustrated in FIG. 3 through FIG. 6, power requirements may increase only fractionally as the overall memory structure size increases, primarily because only the memory module, and associated local bitlines and local word lines are activated during a given operation. Due to the localized functionality, the global bitlines and word lines are activated for relatively brief periods at the beginning and end of the operation. In any event, power consumption is generally dictated by the bit size of the word, and the basic module configuration, i.e., the number of rows and row length of modules 620*a–e*. Thus, significant benefits can be realized by judiciously selecting the configuration of a memory module, relative to the overall memory structure configuration. For example, in a memory structure according to the present invention, a doubling in the size of the memory device can account for power consumption increase of about twenty percent, and not a doubling, as found in prior art designs. Furthermore, a memory structure according to the present invention can realize a four-to-six-fold decrease in power requirements and can operate 30% to 50% faster, and often more, than traditional architectures.

Figure 7:
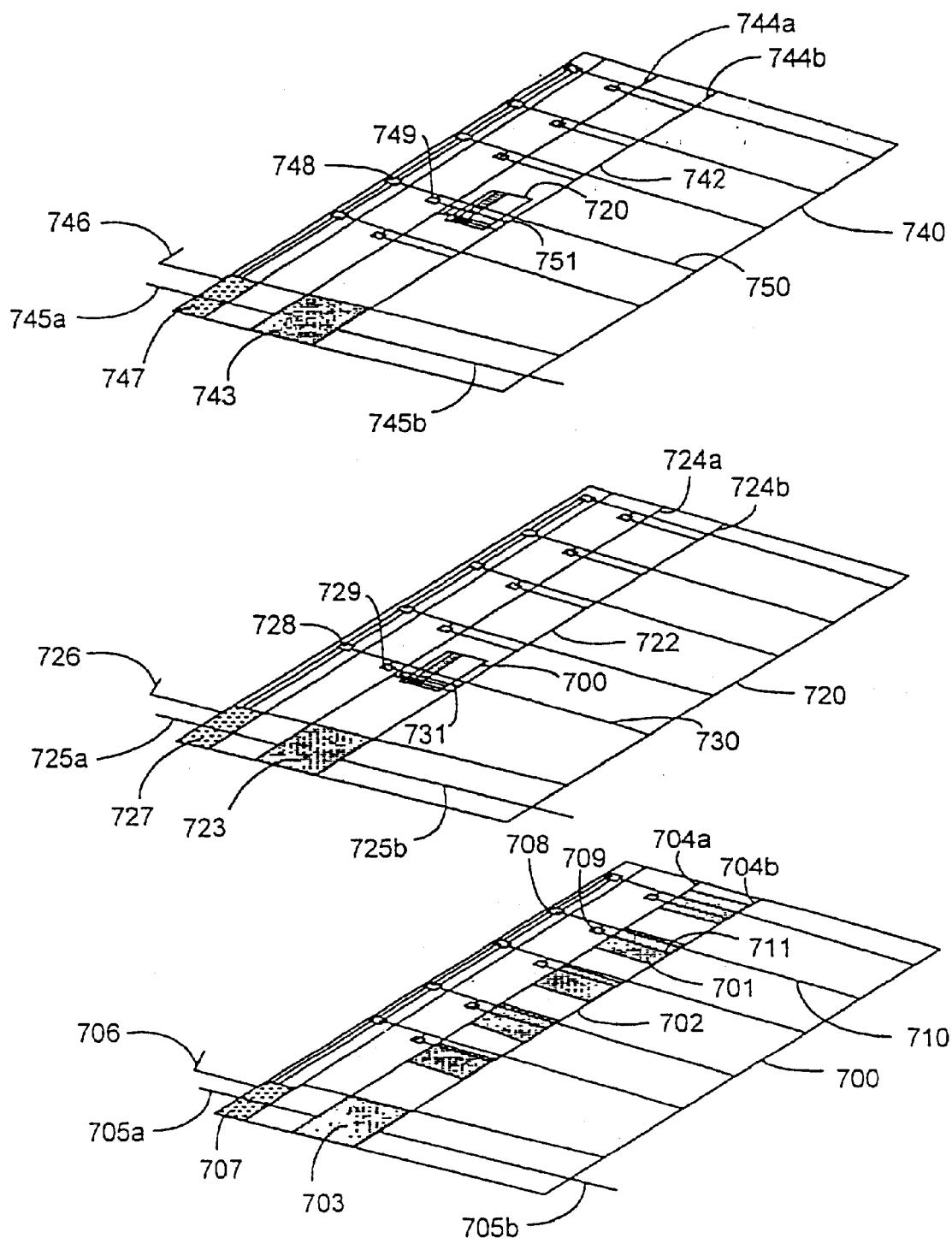
FIG. 7 is a perspective illustration of a hierarchical memory structure having a three-tier hierarchy, in accordance with the invention herein.

FIG. 7 illustrates that memory structures according to the present invention, for example memory structure 740, are fully hierarchical, in that each tier within the hierarchy includes local bit line sensing, local word line decoding, or both. Exemplary memory structure 740 is three-tier hierarchical device with memory module 700 being representative of the fundamental, or lowest, tier ($L_0$) of the memory hierarchy; memory device 720 being representative of the intermediate tier($L_1$) of the memory hierarchy; and memory structure 740 being representative of the upper tier ($L_2$) of the memory hierarchy. For the sake of simplicity, only one memory column is shown at each tier, such that memory column 702 is intended to be representative of fundamental tier ($L_0$), memory column 722 of intermediate tier ($L_1$), and memory column 742 of upper tier ($L_2$).

Tier $L_0$ memory devices, such as memory module 700, are composed of multiple memory cells, generally indicated by memory cell 701, which can be disposed in row, column, or 2-D array (row and column) formats. Memory module 700 is preferred to employ local bit line sensing, local word line decoding, or both, as was described relative to FIGS. 3 through 6. In the present example, module M00 includes both local bit line sensing and local word line decoding. Each memory cell M01 in a respective column of memory cells 702 is coupled with local sense amplifier 703 by local bit lines 704*a*, 704*b*. Although local bit line sensing can be performed on a memory column having a single memory cell, it is preferred that two, or more, memory cells 701 be coupled with local sense amplifier 703. Unlike some prior art memory devices which dispense with local bit line sensing by employing special memory cells which provide strong signals at full logic levels, module 700 can use, and indeed is preferred to use, conventional and low-power memory cells 701 as constituent memory cells. An advantage of local bit line sensing is that only a limited a voltage swing on bit lines 704*a*, 704*b* may be needed by local sense amplifier 703 to accurately sense the state of memory cell 701, which permits rapid memory state detection and reporting using substantially less power than with prior art designs.

Tier $L_0$ local sense amplifier 703 detects the memory state of memory cell 701 by coupling the memory state signal to tier $L_0$ local sense amplifier 703, via local bit lines 704*a*, 704*b*. It is preferred that the memory state signal be a limited swing voltage signal. Amplifier 703 transmits a sensed signal representative of the memory state of memory cell 701 to tier $L_1$ sense amplifier 723 via tier $L_0$ local sense amplifier outputs 705*a*, 705*b*, which are coupled with intermediate tier bit lines 724*a*, 724*b*. It is preferred that the sensed signal be a limited swing voltage signal, as well. In turn, amplifier 723 transmits a second sensed signal representative of the memory state of memory cell 701 to tier $L_2$ sense amplifier 743, via tier $L_1$ local sense amplifier outputs 725a, 725b, which are coupled with upper tier bit lines 744a, 744b. It also is preferred that the second sensed signal be a limited voltage swing signal.

Where tier $L_2$ is the uppermost tier of the memory hierarchy, as is illustrated in the instant example, sense amplifier 743 can be a global sense amplifier, which propagates a third signal representative of memory cell 701 to associated I/O circuitry (not shown)via sense amplifier output lines 746a, 746b. Such I/O circuitry can be similar to I/O in FIG. 1. However, the present invention contemplates a hierarchical structure that can consist of two, three, four, or more, tiers of hierarchy. The uppermost tier signal can be a full-swing signal. In view of FIG. 7, a skilled artisan would realize that "local bit line sensing" occurs at each tier $L_0$, $L_1$, and $L_2$, in the exemplary hierarchy, and is desirable, for example, because only a limited voltage swing may be needed to report the requested memory state from a lower tier in the hierarchy to the next higher tier.

Hierarchical memory structures also can employ local word line decoding, as illustrated in memory device 740. In FIG. 7, memory device 740 is the uppermost tier ($L_2$) in the hierarchical memory structure, thus incoming global word line signal 746 is received from global word line drivers (not shown) such as global row address decoders 110 in FIG. 1. In certain preferred embodiments of the present invention, predecoding is employed to effect rapid access to desired word lines, although predecoding is not required, and may not be desired, at every tier in a particular implementation. Signal M46 is received by upper tier predecoder 747, predecoded and supplied to upper tier ($L_2$) global word line decoders, such as global word line decoder 748. Decoder M48 is coupled with local word line decoder 749 by way of upper tier global word line 750, and selectively activates upper tier local word line decoder 749. Activated $L_2$ local decoder M49, in turn, activates $L_2$ local word line 751, which propagates selected word line signal 726 to intermediate tier ($L_1$) predecoder 727. Predecoder 727 decodes and activates the appropriate intermediate tier ($L_1$) global word line decoder, such as global word line decoder 728. Decoder 728 is coupled with, and selectively activates, tier $L_1$ local word line decoder 729 by way of tier ($L_1$) global word line 730. Activated $L_1$ local decoder 729, in turn, propagates a selected word line signal 706 to fundamental tier ($L_0$) predecoder 707, which decodes and activates the appropriate tier $L_0$ global word line decoder, such as global word line decoder 708. Activated $L_0$ local decoder 709, in turn, activates $L_0$ local word line 711, and selects memory cell 701 for access. In view of the foregoing discussion of hierarchical word line decoding, a skilled artisan would realize that "local word line decoding" occurs at each tier $L_0$, $L_1$, and $L_2$ in the exemplary hierarchy, and is desirable because a substantial reduction in the time and power needed to access selected memory cells can be realized.

Although local word line decoding within module 700 is shown in the context of a single column of memory cells, such as memory columns 702, 722, 742, the present invention contemplates that local word line decoding be performed across two, or more, columns in each of hierarchy tiers, with each of the rows in the respective columns employing two or more local word line decoders, such as local word line decoders 709, 729, 749 which are coupled with respective global word line decoders, such as global word line decoders 708, 728, 748 by way of respective global word lines, such as global word lines 710, 730, 750. However, there is no requirement that equal numbers of rows and columns be employed at any two tiers of the hierarchical structure. In general, memory device 720 can be composed of multiple memory modules 700, which fundamental modules 700 can be disposed in row, column, or 2-D array (row and column) array formats. Such fundamental memory modules can be similar to those illustrated with respect to FIG. 3 through FIG. 6, and combinations thereof. Likewise, memory device 740 can be composed of multiple memory devices 720, which intermediate devices 720 also can be disposed in row, column, or 2-D array (row and column) formats. This extended, and extendable, hierarchality permits the formation of multidimensional memory modules that are distinct from prior art hierarchy-like implementations, which generally are 2-D groupings of banked, paged, or segmented memory devices, or register file memory devices, lacking local functionality at each tier in the hierarchy.

Fast Decoder with Asynchronous Reset

Typically, local decoder reset can be used to generate narrow pulse widths on word lines in a fast memory device. The input signals to the word line decoder are generally synchronized to a clock, or chip select, signal. However, it is desirable that the word line be reset independently of the clock and also of the varying of the input signals to the word line decoder.

Figure 8:
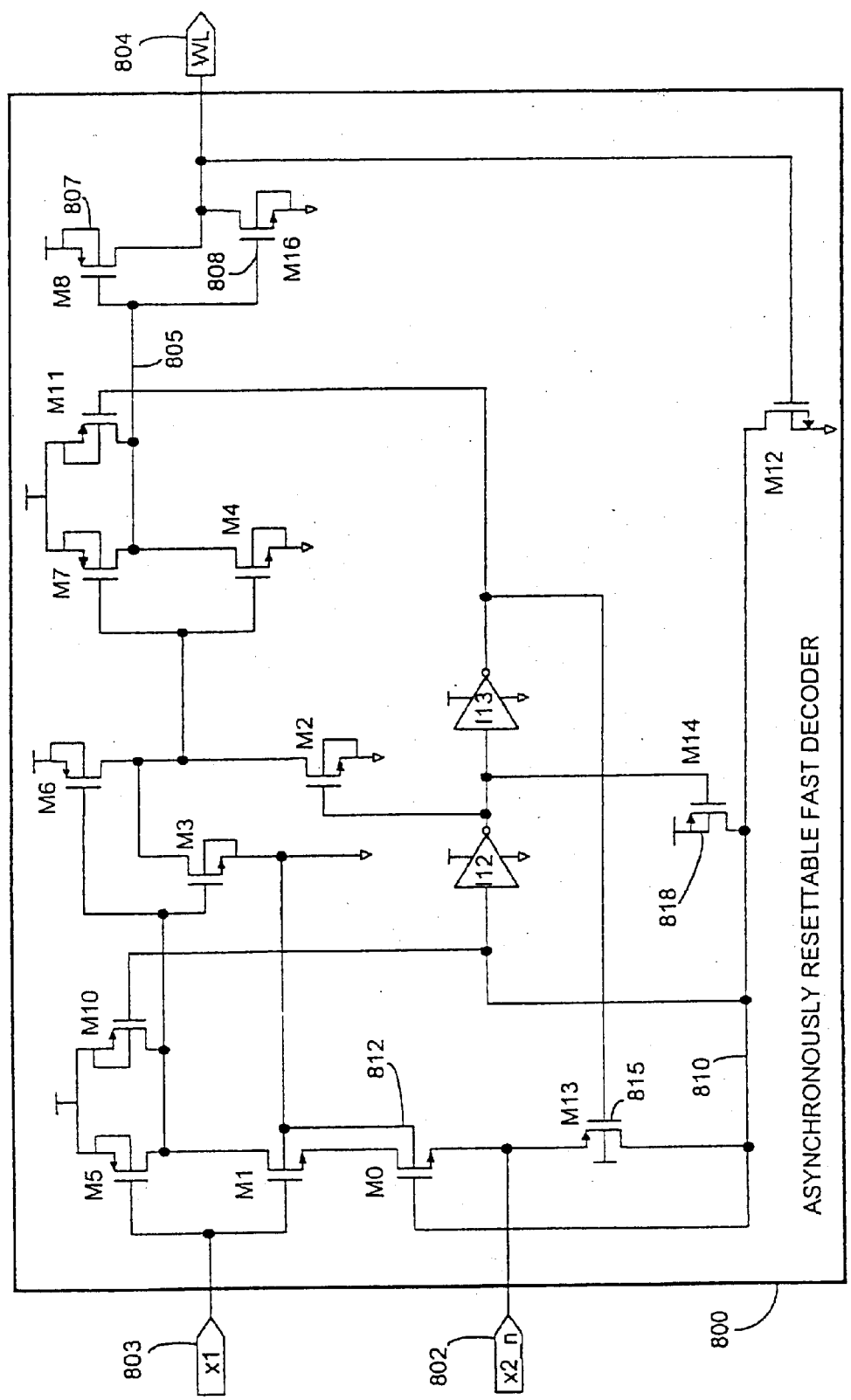
FIG. 8 is a circuit schematic of an asynchronously-resettable decoder, according to an aspect of the present invention.

FIG. 8 is a circuit diagram illustrative of an asynchronously-resettable decoder 800 according to this aspect of the present invention. It may be desirable to implement the AND function, for example, by source-coupled logic. The capacitance on the input x2_n 802 can be generally large, therefore the AND function is performed with about one inverter delay plus three buffer stages. The buffers are skewed, which decreases the load capacitance by about one-half and decreases the buffer delay.

In order to be able to independently reset word line WL 804, it is desirable that inputs 802, 803 be isolated from output 804, and the node 805 should be charged to $V_{dd}$, turning off the large PMOS driver M8 807 once word line WL 804 is set to logical HIGH. Charging of node 805 to $V_{dd}$ can be accomplished by a feedback-resetting loop. Inputs 802, 803 can be isolated from output 804 setting NMOS device 808 to logic LOW. When output WL 804 goes high, monitor node 810 is discharged to ground, and device M0 812 is shut-off, thus isolating inputs 802, 803 from output WL 804. The feedback loop precharges the rest of the nodes in the buffers via monitor node 810, and PMOSFET M13 815 is turned on, connecting the input x2_n 802 to node 810. Decoder 800 will not fire again until x2_n 802 is reset to $V_{dd}$, which usually happens when the system clock signal changes to logic LOW. Once x2_n 802 is logic HIGH, node 810 charges to $V_{dd}$, with the assistance of PMOS device M14 818, and device M0 812 is turned on. This turns off PMOS device M13 815, thus isolating input x2_n 802 from the reset loop which employs node 810. Decoder 800 is now ready for the next input cycle.

Limited Swing Driver Circuit

Figure 9:
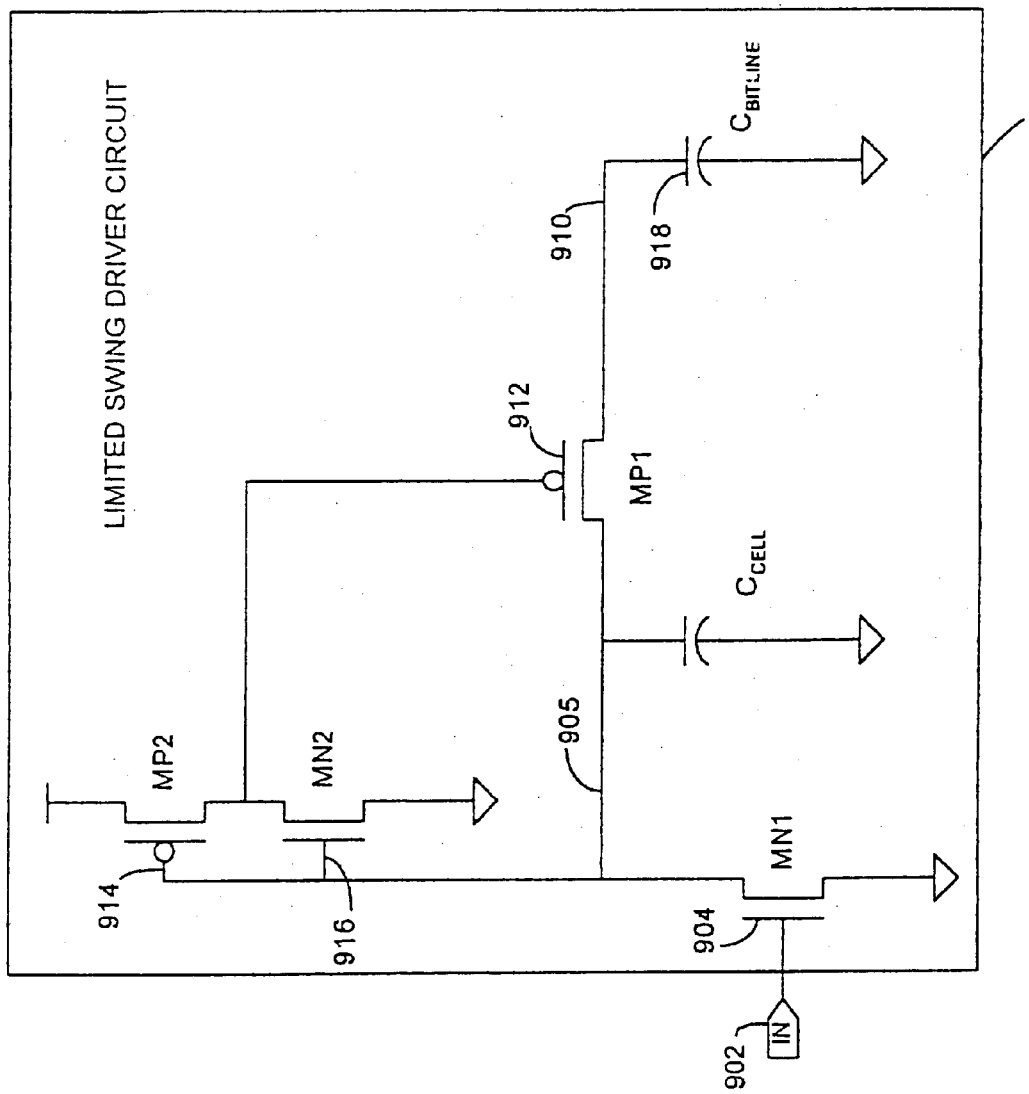
FIG. 9 is a circuit schematic of a limited swing driver circuit, according to an aspect of the present invention.

FIG. 9 illustrates limited swing driver circuit 900 according to an aspect of the invention herein. In long word length memories, a considerable amount of power may be consumed in the data buses. Limiting the voltage swing in such buses can decrease the overall power dissipation of the system. This also can be true for a system where a significant amount of power is dissipated in switching lines with high capacitance. Limited-swing driver circuit 900 can reduce power dissipation, for example, in high capacitance lines. When IN signal 902 is logic HIGH, NMOS transistor MN1 904 conducts, and node 905 is effectively pulled to ground. In addition, bitline 910 is discharged through PMOSFET MP1 912. By appropriate device sizing, the voltage swing on bitline 910 can be limited to a desired value, when the inverter, formed by CMOSFETS MP2 914 and MN2 916, switches OFF PMOSFET MP1 912. In general, the size of circuit 900 is related to the capacitance ($C_{bitline}$) 918 being driven, and the sizes of MP2 914 and MN2 916. In another embodiment of this aspect of the present invention, limited swing driver circuit includes a tri-state output enable, and a self-resetting feature. Tri-state functionality is desirable when data lines are multiplexed or shared. Although the voltage at memory cell node 905 can swing to approximately zero volts, it is most desirable that the bitline voltage swing only by about 200–300 mV.

Single-Ended Sense Amplifier with Sample-and-Hold Reference

Figure 10:
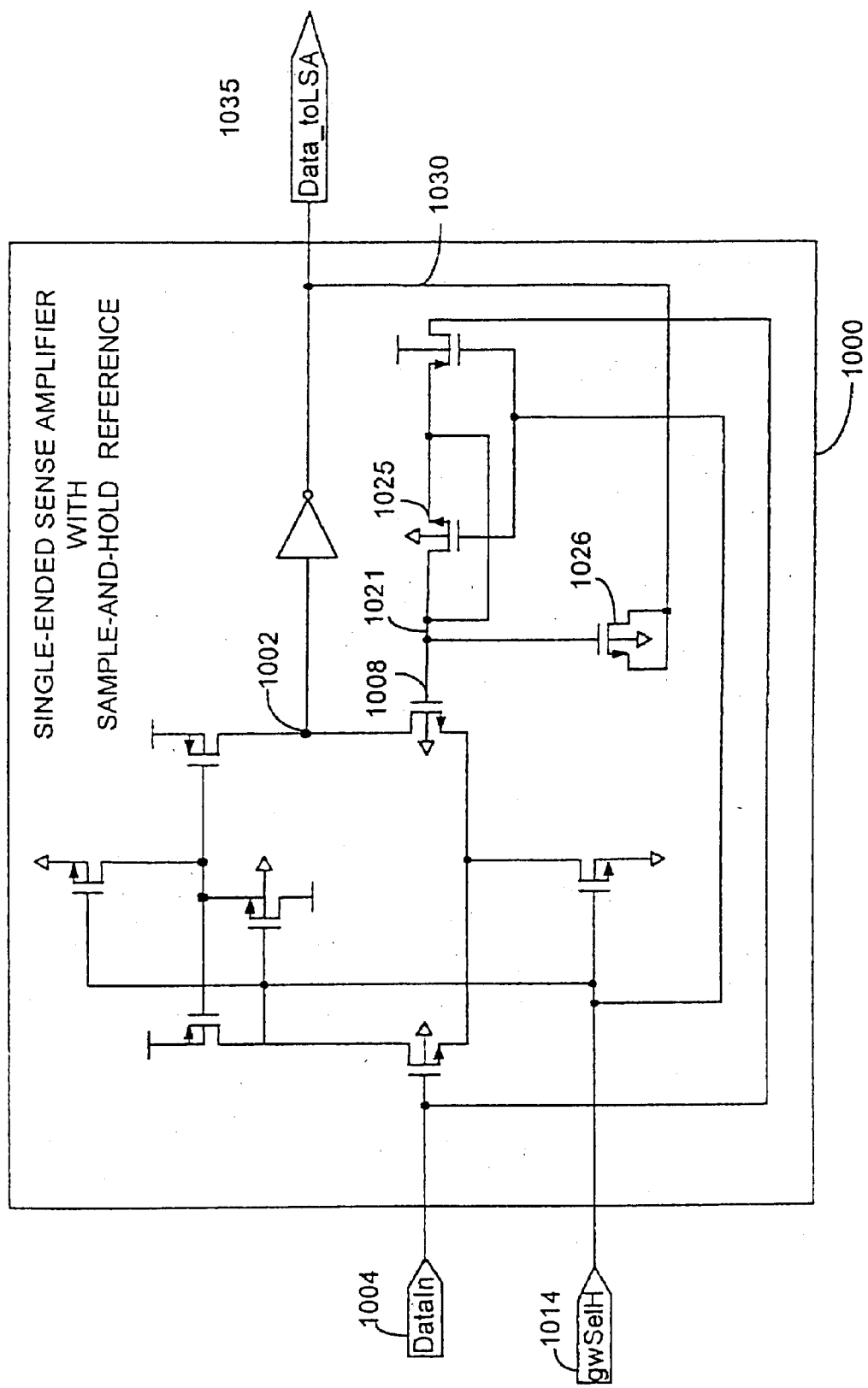
FIG. 10 is a circuit schematic of a single-ended sense amplifier circuit with sample-and-hold reference, according to an aspect of the present invention.
Figure 11:
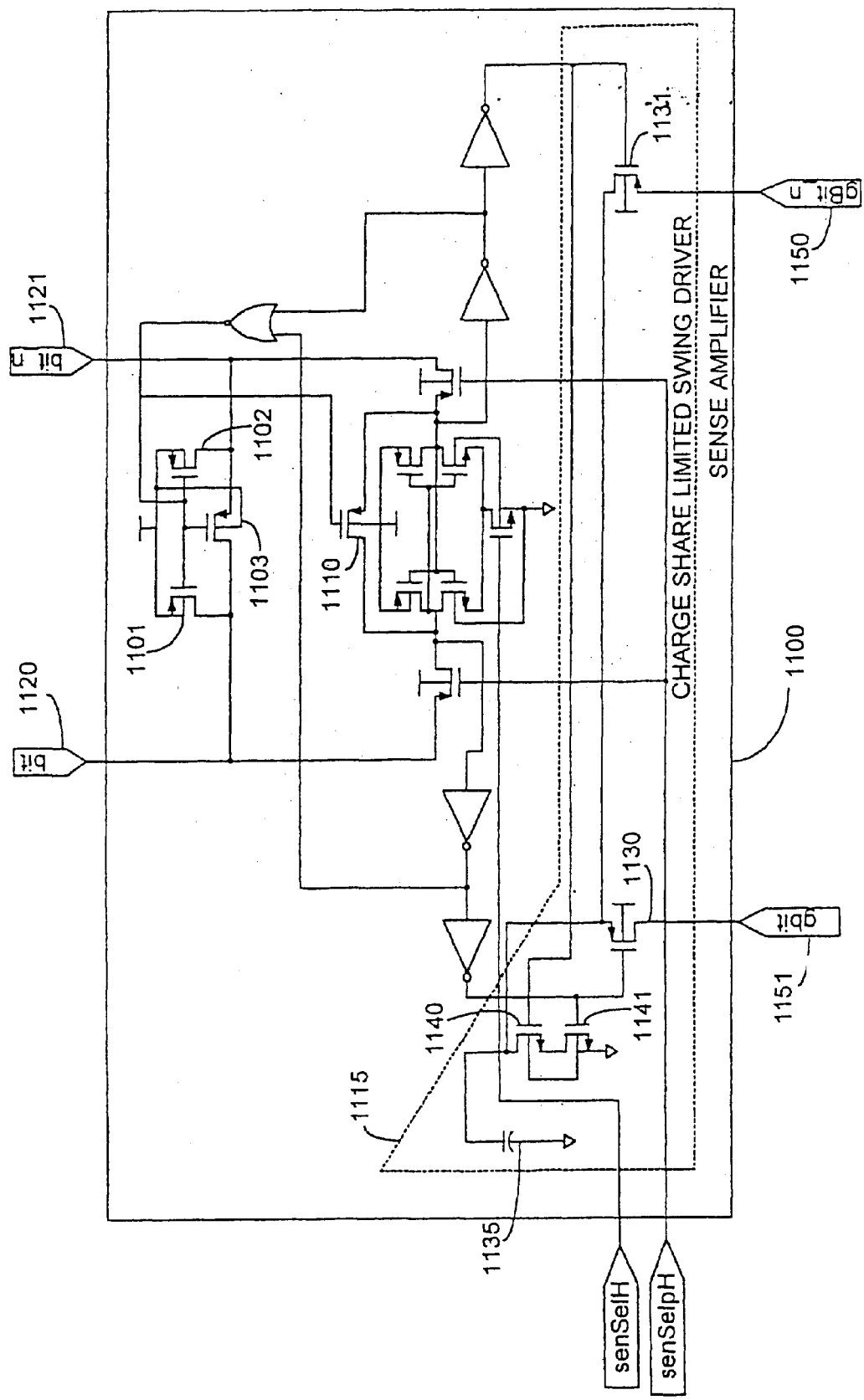
FIG. 11 is a circuit schematic of charge-share, limited-swing driver sense amplifier circuit, according to an aspect of the present invention.

In general, single-ended sense amplifiers are useful to save metal space, however, existing designs tend not to be robust due to their susceptibility to power supply and ground noise. In yet another aspect of the present invention, FIG. 10 illustrates a single-ended sense amplifier 1000, preferably with a sample-and-hold reference. Amplifier 1000 can be useful, for example, as a global sense amplifier, sensing input data. At the beginning of an operation, DataIn 1004 is sampled, preferably just before the measurement begins. Therefore, supply, ground, or other noise will affect the reference voltage of sense amplifier 1000 generally in the same way noise affects node to be measured, tending to increase the noise immunity of the sense amplifier 1000. Both inputs 1010, 1011 of differential amplifier 1012 are at the voltage level of DataIn 1004 when the activate signal (GWSELH) 1014 is logic LOW (i.e., at zero potential). At a preselected interval before the measurement begins, but before DataIn 1013 begins to change, activate signal (GWSELH) 1014 is asserted to logic HIGH, thereby isolating the input node 1002 of the transistor M162 1008. The DataIn voltage existing just before the measurement is taken is sampled and held as a reference, thereby making the circuit substantially independent of ground or supply voltage references. Transistors M190 1025 and M187 1026 can add capacitance to the node 1021 where the reference voltage is stored. Transistor M190 1025 also can be used as a pump capacitance to compensate for the voltage decrease at the reference node 1021 when the activate signal becomes HIGH and pulls the source 1002 of M162 1008 to a lower voltage. Feedback 1030 from output data Data_toLSA 1035, being transmitted to a local sense amplifier (not shown), is coupled with the source/drain of transistor M187 1026, actively adjusting the reference voltage at node 1021 by capacitive coupling, thereby adjusting the amplifier gain adaptively.

Sense Amplifier with Offset Cancellation and Charge-share Limited Swing Drivers

In yet another aspect of the present invention, a latch-type sense amplifier 1100 with dynamic offset cancellation is provided. Sense amplifier 1100 also may be useful as a global sense amplifier, and is suited for use in conjunction with hierarchical bitline sensing. Typically, the sensitivity of differential sense amplifiers can be limited by the offsets caused by inherent process variations for devices ("device matching"), and dynamic offsets that may develop on the input lines during high-speed operation. Decreasing the amplifier offset usually results in a corresponding decrease in the minimum bitline swing required for reliable operation. Smaller bitline swings can lead to faster, lower power memory operation. With amplifier 1100, the offset on bitlines can be canceled by the triple PMOS precharge-and-balance transistors M3 1101, M4 1102, M5 1103, which arrangement is known to those skilled in the art. However, despite precharge-and-balance transistors 1101–1103, an additional offset at the inputs of the latch may exist. By employing balancing PMOS transistor (M14) 1110, any offset that may be present at the input of the latch-type differential sense amplifier can be substantially equalized. Sense amplifier 1100 demonstrates a charge-sharing limited swing driver 1115. Global bitlines 1150, 1151 are disconnected from sense amplifier 1100 when sense amplifier 1100 is not being used, i.e., in a tri-state condition. Sense amplifier 1100 can be in a precharged state if both input/output nodes are logic HIGH, i.e., if both of the PMOS drivers, M38 1130 and M29 1131 are off (inputs at logic HIGH). A large capacitor, $C_0$ 1135, in sense amplifier 1100 can be kept substantially at zero volts by two series NMOS transistors, M37 1140 and M40 1141. The size of capacitor 1135 can be determined by the amount of voltage swing typically needed on global bitlines 1120, 1121.

When sense amplifier 1100 is activated, and bitlines 1150, 1151 are logic HIGH, PMOS transistor M29 1131 is turned on and global bit_n 1150 is discharged with a limited swing. When a bit to be read is logic LOW, PMOS transistor M38 1130 is turned on, and the global bit 1151 is discharged with a limited swing. This charge-sharing scheme can result in very little power consumption, because only the charge that causes the limited voltage swing on the global bitlines 1150, 1151 is discharged to ground. That is, there is substantially no "crowbar" current. Furthermore, this aspect of the present invention can be useful in memories where the global bitlines are multiplexed for input and output.

Module-tier Memory Redundancy Implementation

Figure 12:
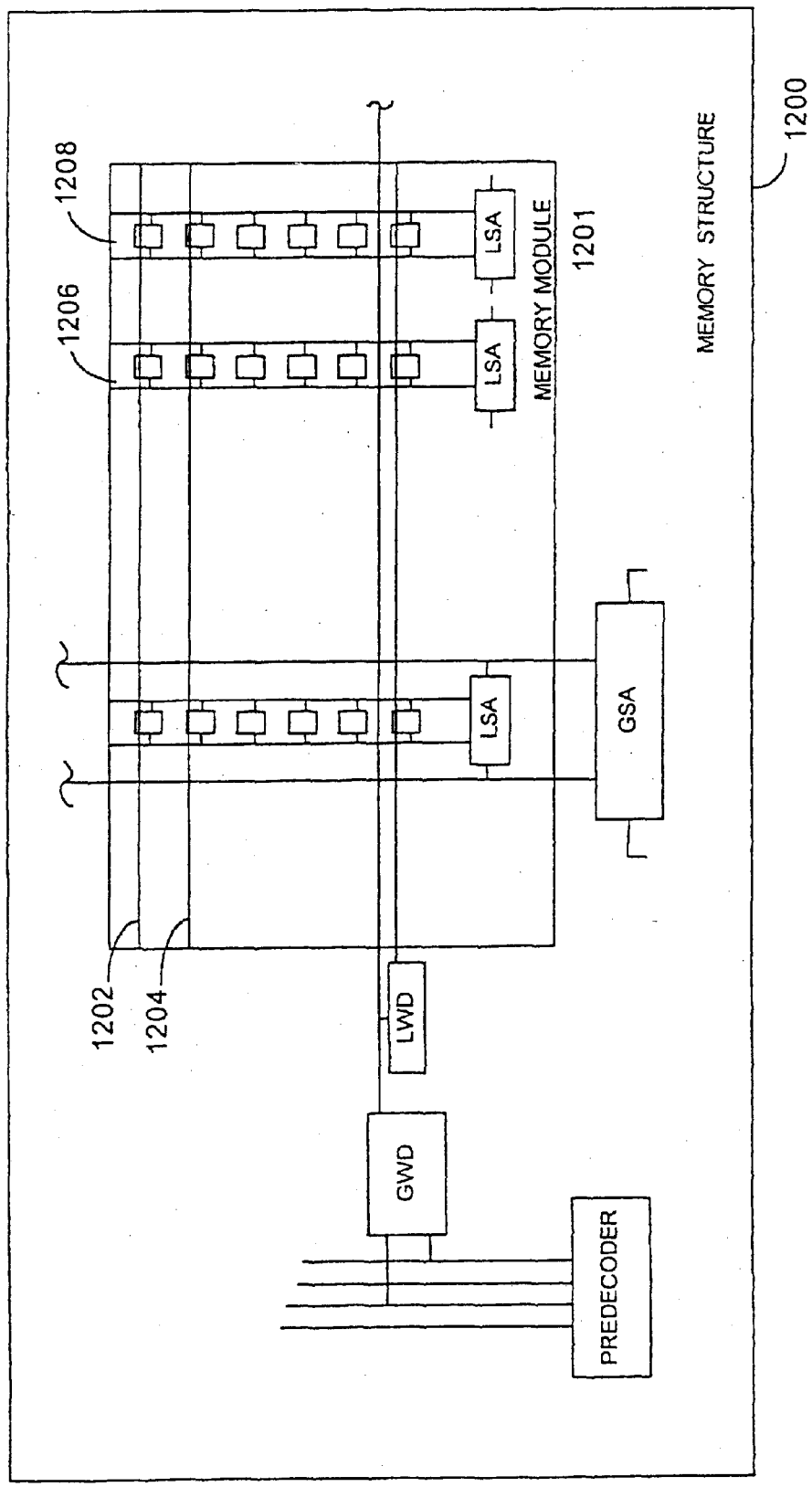
FIG. 12 is a block diagram illustrating an embodiment of hierarchical memory module redundancy.

In FIG. 12, memory structure 1200, composed of hierarchical functional memory modules 1201 is preferred to have at least one or more redundant memory rows 1202, 1204; one, or more redundant memory columns 1206, 1208; or both, within each module 1201. It is preferred that the redundant memory rows 1202, 1204, and/or columns 1206, 1208 be paired, because it has been observed that bit cell failures tend to occur in pairs. Module-level redundancy, as shown in FIG. 12, where redundancy is implemented using a preselected number of redundant memory rows 1202, 1204, or redundant memory columns 1206, 1208, within memory module 1201, can be a very area-efficient approach provided the typical number of bit cell failures per module remains small. By implementing only a single row 1202 or a single column 1206 or both in memory module 1201, only one additional multiplexer is needed for the respective row or column. Although it may be simpler to provide redundant memory cell circuits that can be activated during product testing during the manufacturing stage, it may also be desirable to activate selected redundant memory cells when the memory product is in service, e.g., during maintenance or on-the-fly during product operation. Such activation can be effected by numerous techniques and support circuitry which are well-known in the art.

Redundant Module Memory Redundancy Implementation

Figure 13:
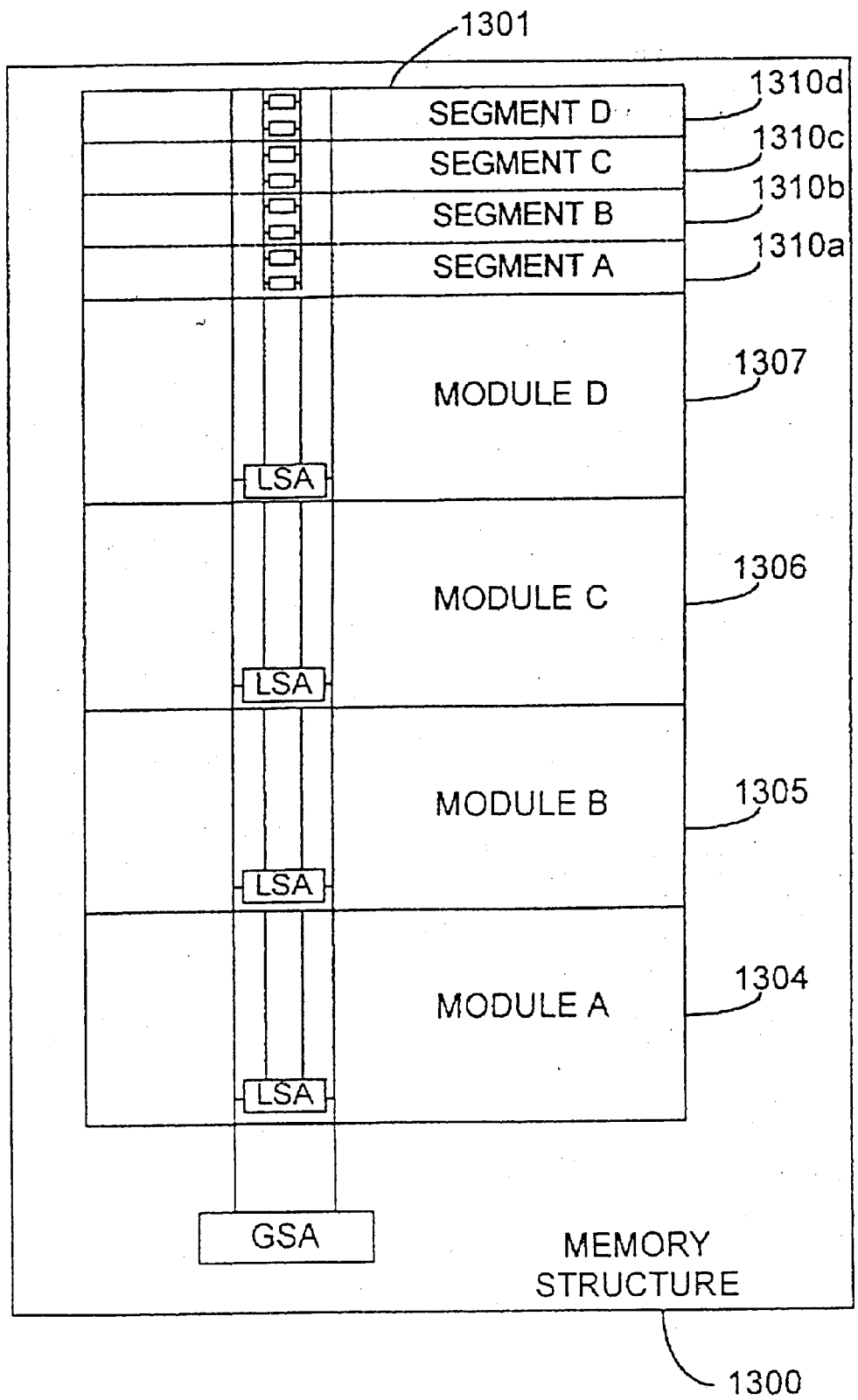
FIG. 13 is a block diagram illustrating another embodiment of hierarchical memory module redundancy.

As shown in FIG. 13, memory redundancy also may be implemented by providing redundant module 1301 to memory structure 1300, which is composed of primary modules 1304, 1305, 1306, 1307. Redundant module 1301 can be a one-for-one replacement of a failed primary module, e.g, module 1304. In another aspect of the invention, redundant module 1301 may be partitioned into smaller redundant memory segments 1310a–d with respective ones of segments 1310a–d being available as redundant memory cells, for example, for respective portions of primary memory modules 1304–1307 which have failed. The number of memory cells assigned to each segment 1310a–d in redundant memory module 1301, may be a fixed number, or may be flexibly allocatable to accommodate different numbers of failed memory circuits in respective primary memory modules 1304–1307.

Memory Redundancy Device

Figure 14:
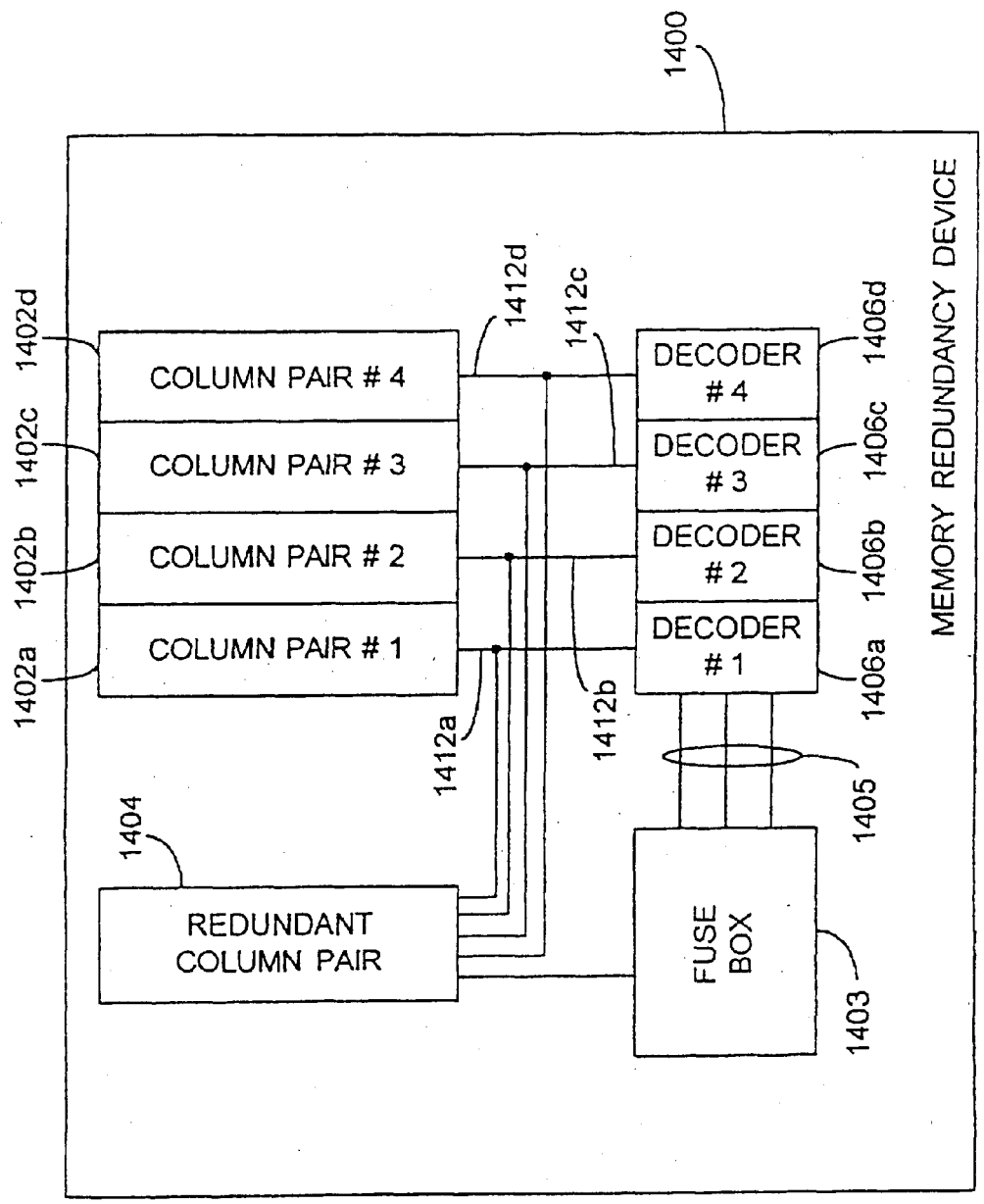
FIG. 14 is a block diagram of a memory redundancy device, illustrating yet another embodiment of hierarchical memory module redundancy.

FIG. 14 illustrates another aspect of the present invention which provides an implementation of row and column redundancy for a memory structure such as memory structure 100 in FIG. 1, or memory structure 300 in FIG. 3. This aspect of the present invention can be implemented by employing fuses that are programmable, for example, during production. Examples of such uses include metal fuses that are blown electrically, or by a focused laser; or a double-gated device, which can be permanently programmed. Although the technique can be applied to provide row redundancy, or column redundancy, or both, the present discussion will describe column redundancy in which both inputs and outputs may need the advantages of redundancy.

FIG. 14 shows an embodiment of this aspect of the invention herein having four pairs of columns 1402a–d with one redundant pair 1404. It is desirable to implement this aspect of the present invention as pairs of lines because a significant number of RAM failures occur in pairs, whether column or row. Nevertheless, this aspect of the present invention also contemplates single line redundancy. In general, the number of fuses in fuse box 1403 used to provide redundancy can be logarithmically related to the number line pairs, e.g., column pairs: $\log_2$ (number of column pairs), where the number of column pairs includes the redundant pairs as well. Because fuses tend to be large, their number should be minimized, thus the logarithmic relation is advantageous. Fuse outputs 1405 are fed into decoder circuits 1406a–d, e.g., one fuse output per column pair. A fuse output creates what is referred to herein as a "shift pointer". The shift pointer indicates the shift signal in the column pair to be made redundant, and subsequent column pairs can then be inactivated. It is desirable that the signals 1405 from fuse box 1410 are decoded to generate shift signal 1412a–d at each column pair. When shift signal 1412a–d for a particular column pair 1402a–d location is selected, as decoded from fuse signals 1405, shift pointer 1412a–d is said to be pointing at this location. The shift signals for this column, and all subsequent columns to the right of the column of pair shift pointer also become inactive.

Figure 15A:
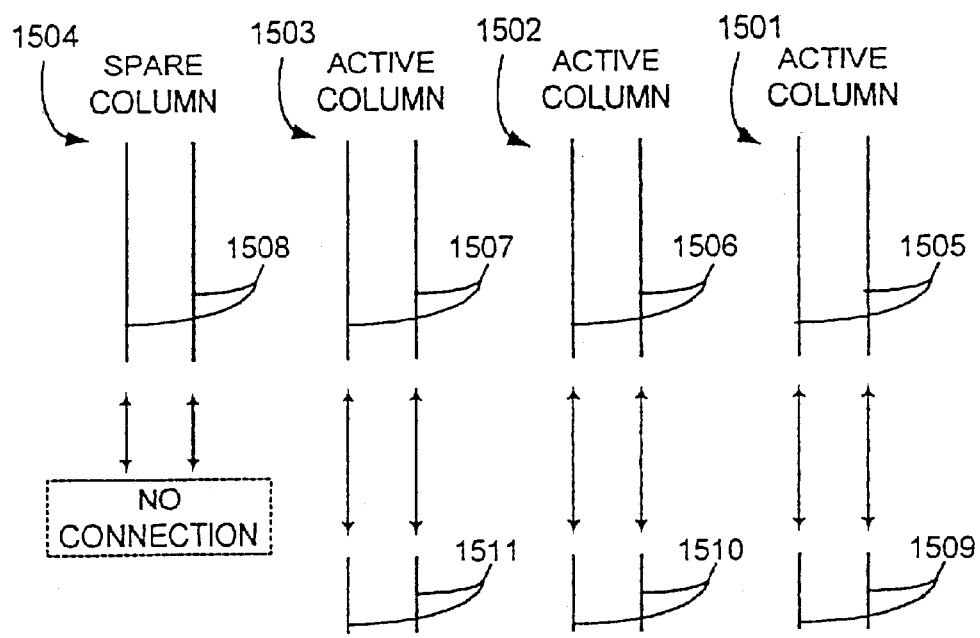
FIG. 15A is a diagrammatic representation of the signal flow of an exemplary unfaulted memory module featuring column-oriented redundancy.
Figure 15B:
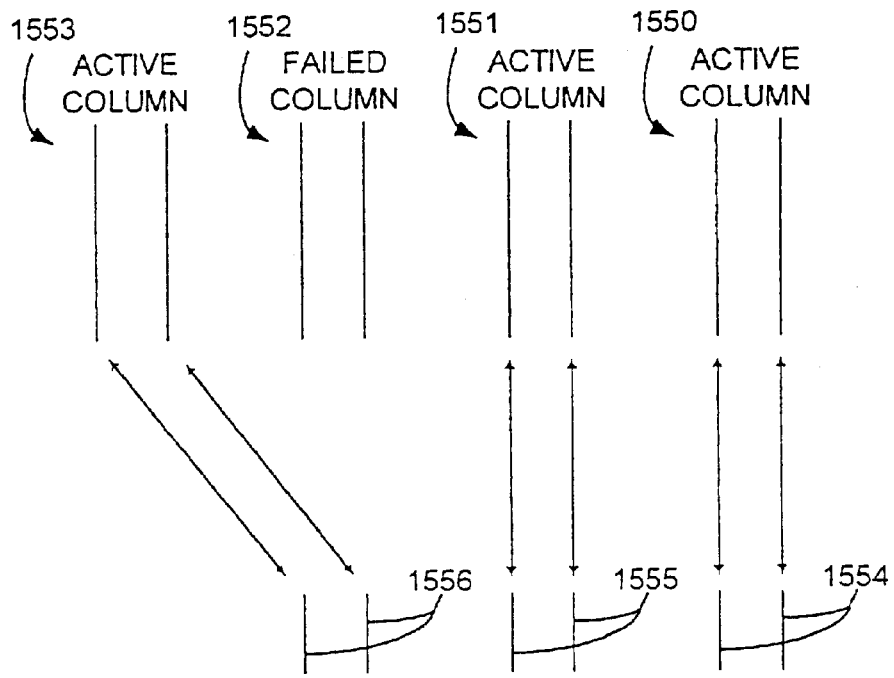
FIG. 15B is a diagrammatic representation of the shifted signal flow of the exemplary faulted memory module illustrated in FIG. 15A.

This aspect of the present invention can be illustrated additionally in FIG. 15A and FIG. 15B, by way of the aforementioned concept of "shift pointers." In FIG. 15A, three column pairs 1501, 1502, 1503, and one redundant column pair 1504 are shown. The shift procedure is conceptually indicated by way of "line diagrams". The top lines 1505–1508 of the line diagrams are representative of columns 1501–1504 within the memory core while bottom line pairs 1509–1511 are the data input/output pairs from the input/output buffers. When a shift signal, such as a signal 1405 in FIG. 14, for a particular column pair 1501–1503 is logical LOW, it is preferred that the data in 1509–1511 be connected to respective column 1501–1503 directly above it by multiplexers. FIG. 15B is illustrative of having a failed column state. When shift signal is logical HIGH, such as a signal 1405 in FIG. 14, a failed column is indicated, such as column 1552. Active columns 1550, 1551 remain unfaulted, and continue to receive their data via I/O lines 1554, 1555. However, because column 1552 has failed, data from I/O buffer 1556 can be multiplexed to the redundant column pair 1553. Diagrammatically, it appears that data in are shifted left while data out from the memory core columns are shifted right. By adjusting the location of the shift pointer, which generally is determined by the state of the fuses, the unused redundant column pair can be shifted to coincide with a nonfunctional column, e.g., column 1552, thereby repairing the column fault and boosting the fully functional memory yield.

Selector for Redundant Memory Circuits

Figure 16:
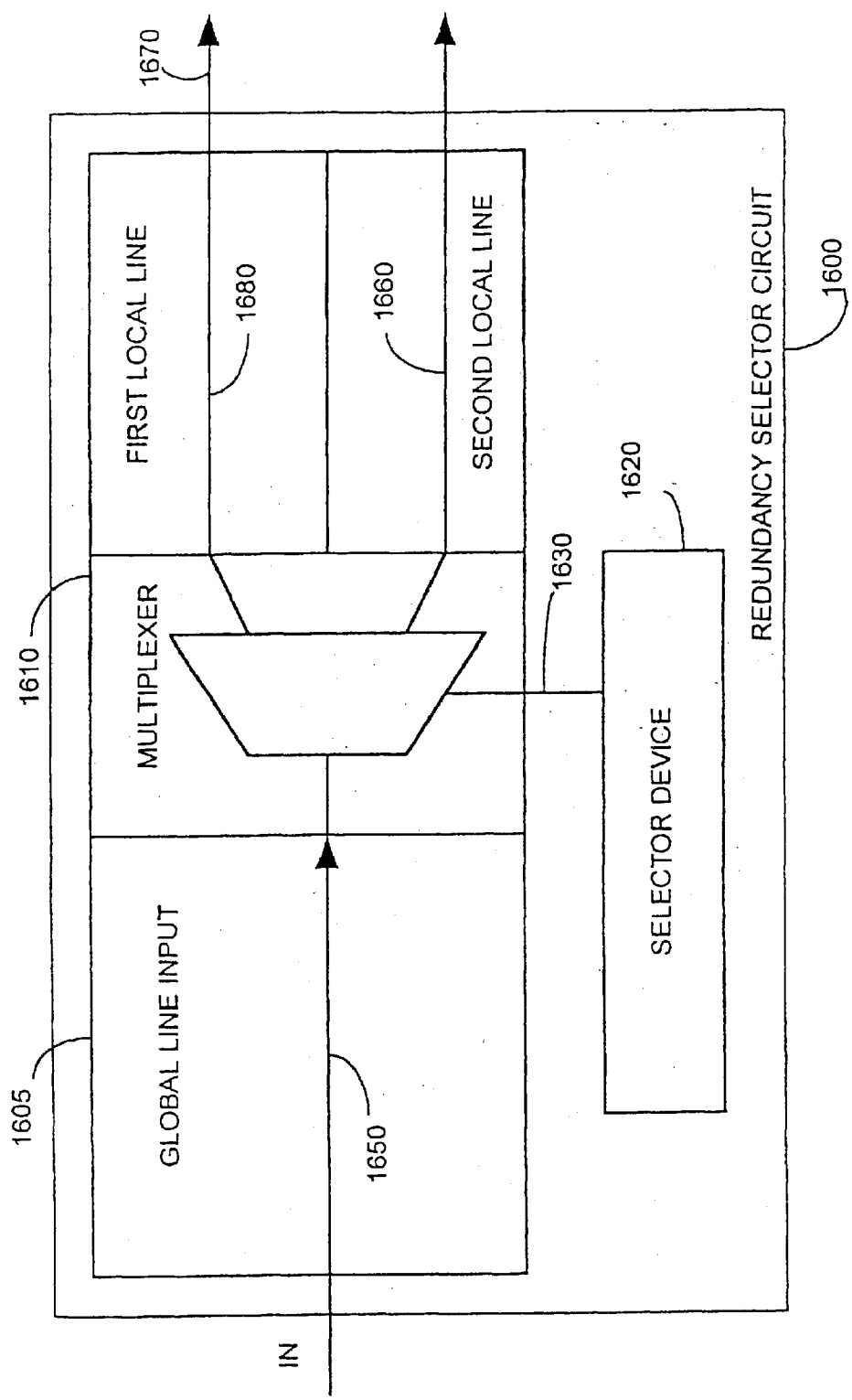
FIG. 16 is a generalized block diagram of a redundancy selector circuit, illustrating still another embodiment of hierarchical memory module redundancy.

FIG. 16 illustrates yet another aspect of the present invention, in which selector 1600 is adapted to provide a form of redundancy. Selector 1600 can include a primary decoder circuit 1605, which may be a global word line decoder, which is coupled with a multiplexer 1610. MUX 1610 can be activated by a redundancy circuit 1620, which may be a fuse system, programable memory, or other circuit capable of providing an activation signal 1630 to selector 1600 via MUX 1610. Selector 1600 is suitable for implementing module-level redundancy, such as that described relative to module 1200 in FIG. 12, which may be row redundancy or column redundancy for a given implementation. In the ordinary course of operation, input word line signal 1650 is decoded in decoder circuit 1605 and, in the absence of a fault on local word line 1670, the word line signal is passed to first local line 1680. In the event a fault is detected, MUX 1610, selects second local line 1660, which is preferred to be a redundant word line.

Fast Decoder with Row Redundancy

Figure 17:
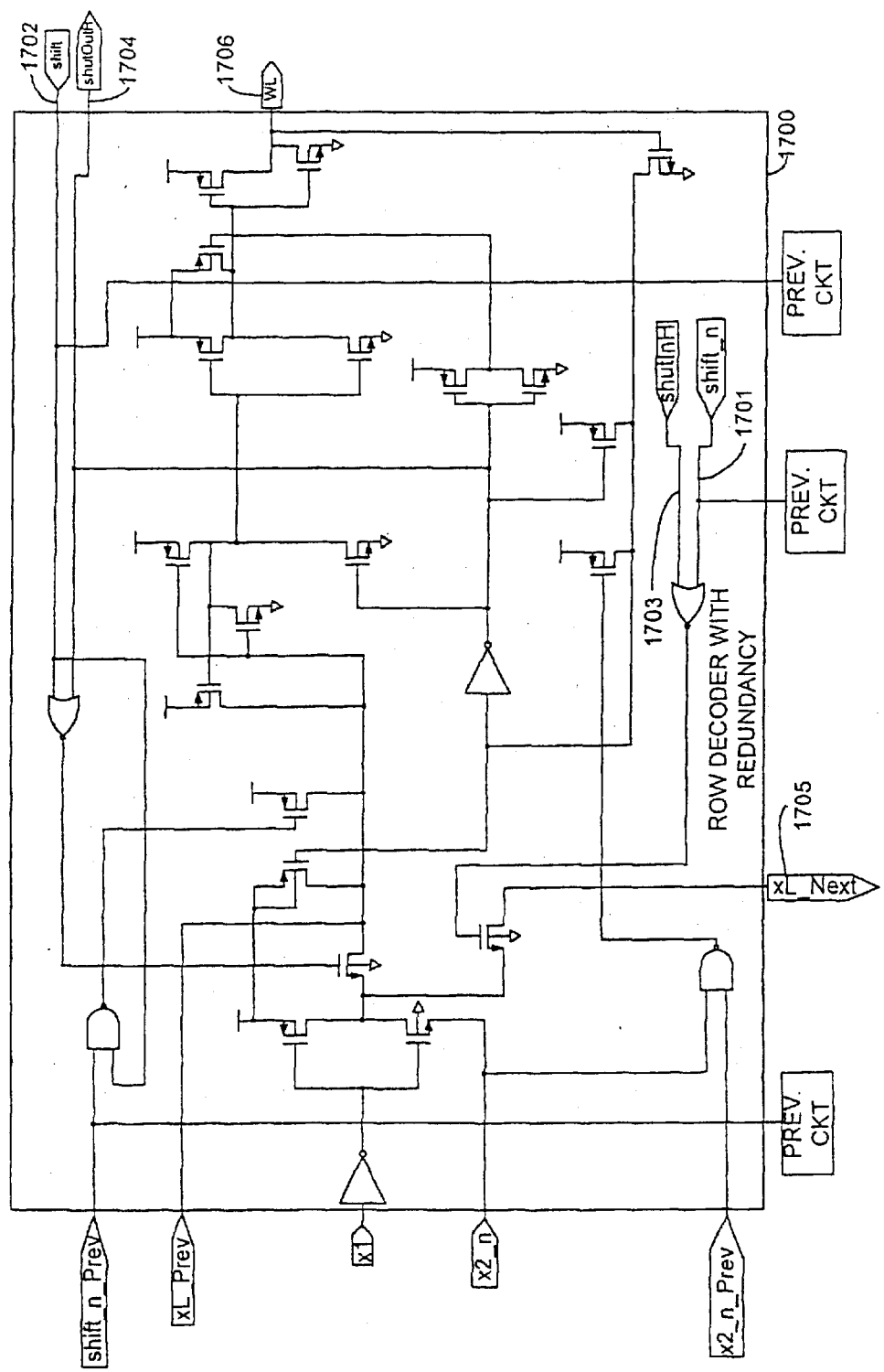
FIG. 17 is a circuit schematic of an embodiment of a global row decoder having row redundancy according to the invention herein.

FIG. 17 illustrates a preferred embodiment of selector 1600 in FIG. 16, in the form of decoder 1700 with row redundancy as realized in a hierarchical memory environment. Decoder 1700 may be particularly suitable for implementing module-level redundancy, such as that described relative to module 1200 in FIG. 12. Global decoder 1700, can operate similarly to the manner of asynchronously-resettable decoder 800 of FIG. 8. In general, decoder 1700 can be coupled with a first, designated memory row, and a second, alternative memory row. Although the second row may be a physical row adjacent the first memory row, and another of the originally designated rows of the memory module, the second row also may be a redundant row which is implemented in the module. Although row decoder 1700 decodes the first memory row under normal operations, it also is disposed to select and decode the second memory row in responsive to an alternative-row-select signal. Where the second row is a redundant row, it may be more suitable to deem the selection signal to be a "redundant-row-select" signal. The aforementioned row select signals are illustrated as inputs 1701 and 1702.

Thus, when input 1701 or 1702 is activated, decoder 1700 transfers the local word line signal, usually output on WL 1706, to be output on xL_Next 1705, which is coupled with an adjacent word line. In general, when a word line decoder, positioned at a particular location in a memory module, receives a shift signal, the remaining decoders subsequent to that decoder also shift, so that the last decoder in the sequence shifts its respective WL data to a redundant word line. Using a two-dimensional conceptual model where a redundant row is at the bottom of a model, this process may be described as having a fault at a particular position effect a downward shift of all local word lines at and below the position of the fault. Those local word lines above the position of the fault can remain unchanged.

Hybrid Single Port and Dual Port (R/W) Functionality

Hierarchical memory module implementations realize significant time savings due in part to localized functionality. Signal propagation times at the local module tier tend to be substantially less than the typical access time of a larger memory structure, even those employing existing paged, banked, and segmented memory array, and register file schemes. Indeed, both read and write operations performed at the fundamental module tier can occur within a fraction of the overall memory structure access time. Furthermore, because bitline sensing, in accordance with the present invention, is power-conservative, and does not result in a substantial decay of precharge voltages, the bitline voltage levels after an operation tend to be marginally reduced. As a result, in certain preferred embodiments of the present invention, it is possible to perform two operations back-to-back without an intervening pre-charge cycle, and to do so within a single access cycle of the overall memory structure. Therefore, although a memory device may be designed as to be single-port device, a preferred memory module embodiment functions similarly to a two-port memory device, which can afford such an embodiment a considerable advantage over prior art memory structures of comparable overall memory size.

Figure 18:
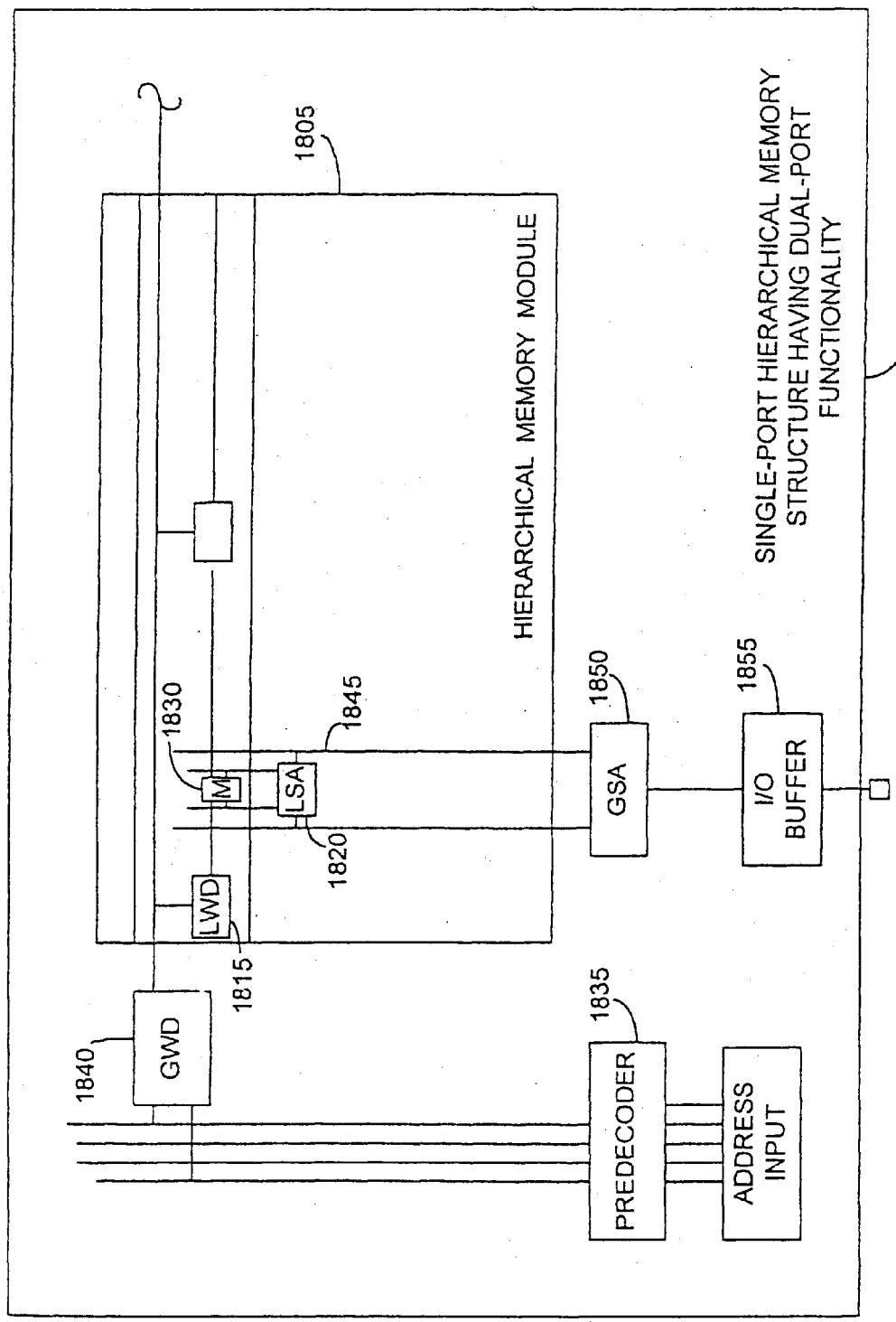
FIG. 18 is a block diagram illustrating dual-port functionality in a single-port hierarchical memory structure employing hierarchical memory modules according to the present invention.

FIG. 18 illustrates one particular embodiment of this aspect of the present invention, in memory structure 1800, where both local bitline sensing and local word line decoding are used, as described above. Memory structure 1800 includes memory module 1805 which is coupled with local word line decoder 1815 and local bit sense amplifier 1820. Within memory module 1805 are a predefined number of memory cells, for example, memory cell 1825, which is coupled with local word line decoder 1815 via local word line 1810, and local bit sense amplifier 1820 via local bitlines 1830. With typical single-port functionality, local bitlines 1830 are precharged prior to both READ and WRITE operations. During a typical READ operation, predecoder 1835 activates the appropriate global word line decoder 1840, which, in turn, activates local word line decoder 1815. Once local word line decoder 1815 determines that associated memory cell 1825 is to be evaluated, it opens memory cell 1825 for evaluation, and activates local bit sense amplifier 1820. At the end of the local sensing period, local bit sense amplifier 1820 outputs the sensed data value onto global bitlines 1845. After global sense amplifier 1850 senses the data value, the data is output to the I/O buffer 1855. If a WRITE operation is to follow the READ operation, a typical single-port device would perform another precharge operation before the WRITE operation can commence.

In this particular embodiment of dual-port functionality, the predecoding step of a subsequent WRITE operation can commence essentially immediately after local bitline sense amplifier 1820 completes the evaluation of memory cell 1825, that is, at the inception of sensing cycle for global sense amplifier 1850, and prior to the data being available to I/O buffer 1855. Thus, during the period encompassing the operation of global sense amplifier 1850 and I/O buffer 1855, and while the READ operation is still in progress, predecoder 1835 can receive and decode the address signals for a subsequent WRITE operation, and activate global word line decoder 1840 accordingly. In turn, global word line decoder 1840 activates local word line 1815 in anticipation of the impending WRITE operation. As soon as the datum is read out of I/O buffer 1855, the new datum associated with the WRITE cycle can be admitted to I/O buffer 1855 and immediately written to, for example, memory cell 1825, without a prior precharge cycle. In order to provide the memory addresses for these READ and WRITE operations in a manner consistent with this embodiment of the invention, it is preferred that the clocking cycle of predecoder 1810 be faster than the access cycle of the overall memory structure 1800. For example, it may be desirable to adapt the predecoding clock cycle to be about twice, or perhaps greater than twice, the nominal access cycle for structure 1800. In this manner, a PRECHARGE-READ-WRITE operation can be performed upon the same memory cell within the same memory module in less than one access cycle, thereby obtaining dual-port functionality from a single port device. It also is contemplated that the aforementioned embodiment can be adapted to realize three or more operations within a single access cycle, as permitted by the unused time during an access cycle.

Fortuitously, the enhanced functionality described above is particularly suited to large memory structures with comparatively small constituent modules, where the disparity between global and local access times is more pronounced. Moreover, in environments where delays due to signal propagation across interconnections, and to signal propagation delays through co-embedded logic components may result in sufficient idle time for a memory structure, this enhanced functionality may advantageously make use of otherwise "wasted" time.

Figure 19:
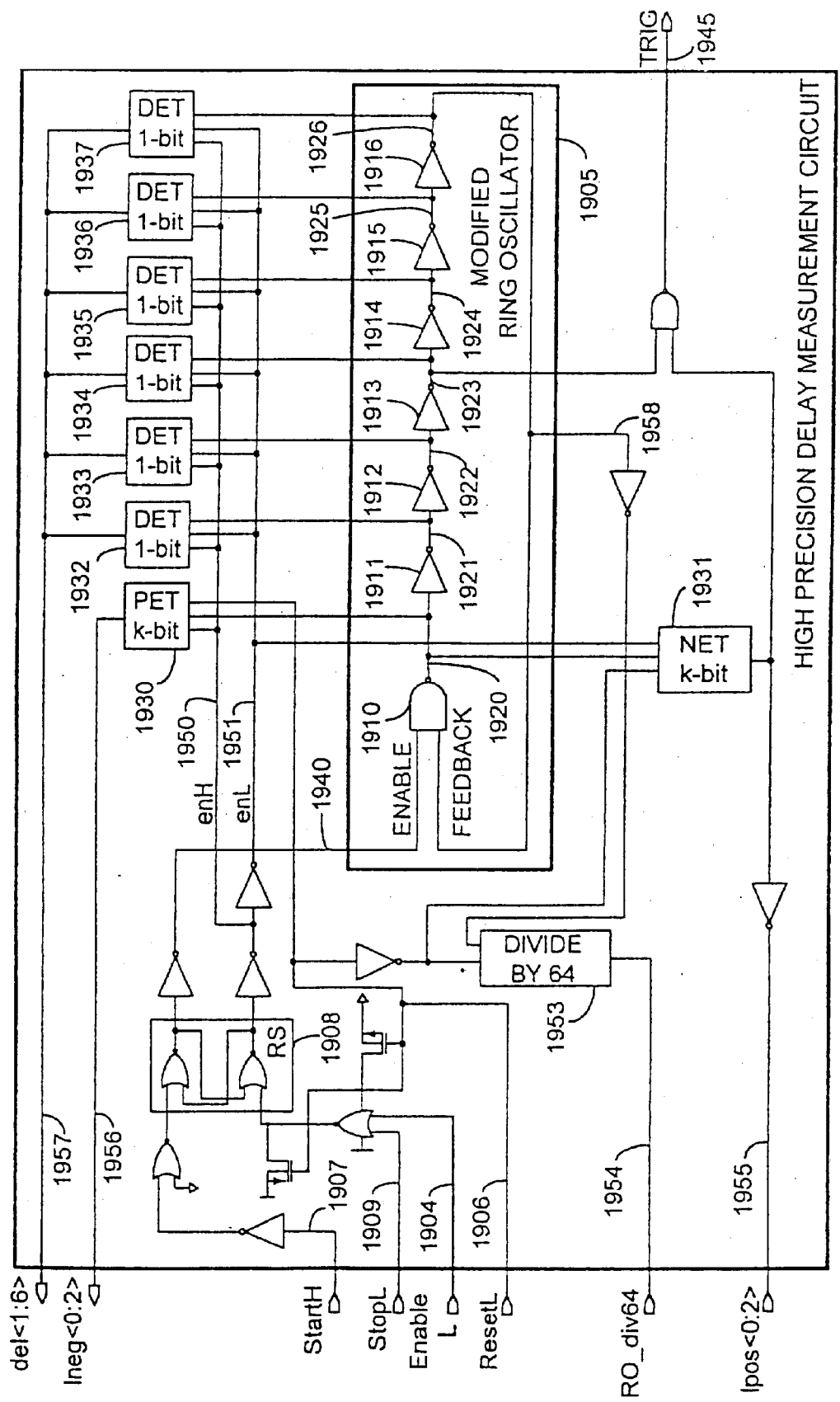
FIG. 19 is a schematic diagram of one embodiment of a high precision delay measurement circuit, according to the present invention.

FIG. 19 illustrates high precision delay measurement (HPDM) circuit 1900, according to one aspect of the present invention, which can provide timing measurements of less than that of a single gate delay, relative to the underlying technology. These measurements can be, for example, of signal delays and periods, pulse widths, clock skews, etc. HPDM circuit 1900 also can provide pulse, trigger, and timing signals to other circuits, including sense amplifiers, word line decoders, clock devices, synchronizers, state machines, and the like. Indeed, HPDM circuit 1900 is a measurement circuit of widespread applicability. For example, HPDM circuit 1900 can be implemented within a high-performance microprocessor, where accurate measurement of internal time intervals, perhaps on the order of a few picoseconds, can be very difficult using devices external to the microprocessor. HPDM circuit 1900 can be used to precisely measure skew between and among signals, and thus also can be used to introduce or eliminate measured skew intervals. HDPM circuit 1900 also can be employed to characterize the signals of individual components, which may be unmatched, or poorly-matched components, as well as to bring such components into substantial synchrony. Furthermore, HPDM circuit 1900 can advantageously be used in register files, transceivers, adaptive circuits, and a myriad of other applications in which precise interval measurement is desirable in itself, and in the context of adapting the behavior of components, circuits, and systems, responsive to those measured intervals.

Advantageously, HPDM circuit 1900 can be devised to be responsive to operating voltage, design and process variations, design rule scaling, etc., relative to the underlying technology, including, without limitation, bipolar, nMOS, CMOS, BiCMOS, and GaAs technologies. Thus, an HPDM circuit 1900 designed to accurately measure intervals relevant to 1.8 micron technology will scales in operation to accurately measure intervals relevant to 0.18 micron technology. Although HPDM circuit 1900 can be adapted to measure fixed time intervals, and thus remain independent of process variations, design rule scaling, etc., it is preferred that HPDM circuit 1900 be allowed to respond to the technology and design rules at hand. In general, the core of an effective HPDM circuit capable of measuring intervals on the order of picoseconds, can require only a few scores of transistors which occupy a minimal footprint. This is in stark contrast to its counterpart in the human-scale domain, i.e., a an expensive, high-precision handheld, or bench side, electronic test device.

One feature of HPDM circuit 1900 is modified ring oscillator 1905. As is well-known in the art of ring oscillators, the oscillation period, $T_O$, of a ring oscillator having N stages is approximately equal to $2NT_D$, where $T_D$ is the large-signal delay of the gate/inverter of each stage. The predetermined oscillation period, $T_O$, can be chosen by selecting the number of gates to be employed in the ring oscillator. In general, $T_D$ is a function of the rise and fall times associated with a gate which, in turn, are related to the underlying parameters including, for example, gate transistor geometries and fabrication process. These parameters are manipulable such that $T_D$ can be tuned to deliver a predetermined gate delay time. In a preferred embodiment of the present invention in the context of a specific embodiment of a hierarchical memory structure, it is desirable that the parameters be related to a CMOS device implementation using 0.18 micron ($\mu$m) design rules. However, a skilled artisan would realize that HPDM circuit 1900 is not limited thereto, and can be employed in other technologies, including, without limitation, bipolar, nMOS, CMOS, BiCMOS, GaAs, and SiGe technologies, regardless of design rule, and irrespective of whether implemented on Si substrate, SOI and its variants, etc.

Although exemplary HPDM circuit 1900 employs seven (7) stage ring oscillator 1905, a greater or lesser number of stages may be used, depending upon the desired oscillation frequency. In this example, ring oscillator 1905 includes NAND gate 1910, the output of which being designated as the first stage output 1920; and six inverter gates, 1911–1916, whose outputs 1921–1926 are respectively designated as the second through seventh stage outputs.

In addition to ring oscillator 1905, HPDM circuit 1900 can include memory elements 1930–1937, each of which being coupled with a preselected oscillator stage. The selection and arrangement of memory elements 1930–1937, make it possible to measure a minimum time quantum, $T_L$, which is accurate to about one-half of a gate delay, that is, $T_L \approx T_D/2$. The maximum length of time, $T_M$, that can usefully be measured by HPDM circuit 1900 is determinable by selecting one or more memory devices, or counters, to keep track of the number of oscillation cycles completed since the activation of oscillator 1905, for example, by ENABLE signal 1940. Where the selected counter is a single 3-bit device, for example, up to eight (8) complete cycles through oscillator 1905 can be detected, with each cycle being completed in $T_O$ time. Therefore, using the single three-bit counter as an example, $T_M \approx 8T_O$. The remaining memory elements 1932–1937 can be used to indicate the point during a particular oscillator cycle at which ENABLE signal 1940 was deactivated, as determined by examining the respective states of given memory elements 1932–1937 after deactivation of oscillator 1905.

In HPDM circuit 1900, it is preferred that a k-bit positive edge-triggered counter (PET) 1930, and a k-bit negative edge-triggered counter (NET) 1931, be coupled with first stage output 1920. Further, it is preferred that a dual edge-triggered counter (DET) 1932–1937 be coupled with respective outputs 1921–1925 of Oscillator 1905. In a particular embodiment of the invention, PET 1930 and NET 1931 are each selected to be threebit counters (i.e., k=3), and each of DET 1932–1937 are selected to be one-bit counters (latches). An advantage of using dual edge detection in counters 1932–1937 is that the edge of a particular oscillation signal propagating through ring oscillator 1905 can be registered at all stages, and the location of the oscillation signal at a specific time can be determined therefrom. Because a propagating oscillation signal alternates polarity during sequentially subsequent passages through ring oscillator 1905, it is preferred to employ both NET circuit 1930 and PET 1931, and that the negative edge of a particular oscillation signal be sensed as the completion of the first looping event, or cycle, through ring oscillator 1905.

The operation of HPDM circuit 1900 can be summarized as follows: with EnableL signal 1904 asserted HIGH, ring oscillator 1905 is in the STATIC mode, so that setting ResetL signal 1906 to LOW resets counters 1930–1937. By setting StartH signal 1907 to HIGH, sets RS flip-flop 1908 which, in turn, sets ring oscillator 1905 to the ACTIVE mode by propagating an oscillation signal. Each edge of, the oscillation signal can be traced by identifying the switching activity at each stage output 1920–1926. PET 1930 and NET 1931, which sense first stage output 1920 identify and count looping events. It is preferred that the maximum delay to be measured can be represented by the maximum count of PET 1930 and NET 1931, so that the counters do not overflow. To stop the propagation of the oscillation signal through ring oscillator 1905, StopL signal 1909 is set LOW, RS flip-flop 1908 is reset, and ring oscillator 1905 is returned to the STATIC mode of operation. Also, the data in counters 19301937 are isolated from output stages 1920–1926 by setting enL signal 1950 to LOW and enH signal 1951 to HIGH. The digital data is then read out through ports lpos 1955, lneg 1956, and del 1957. With knowledge of the average stage delay, the digital data then can be interpreted to provide an accurate measurement, in real time units, of the interval during which ring oscillator 1905 was in the ACTIVE mode of operation. HPDM circuit 1900 can be configured to provide, for example, a precise clock or triggering signal, such as TRIG signal 1945, after the passage of a predetermined quantum of time. Within the context of a memory system, such quantum of time can be, for example, the time necessary to sense the state of a memory cell, to keep active a wordline, etc.

The average stage delay through stages 1910–1916 can be determined by operating ring oscillator 1905 for a predetermined averaging time by asserting StartH 1907 and StopL 1909 to HIGH, thereby incrementing counters 1930–1937. In a preferred embodiment of the present invention, the overflow of NET 1931 is tracked, with each overflow event being indicative of $2^k$ looping events through ring oscillator 1905. It is preferred that this tracking be effected by a divider circuit, for example, DIVIDE-BY-64 circuit 1953. At the end of the predetermined averaging time, data from divider 1953 may be read out through port RO__div64 1954 as a waveform, and then analyzed to determine the average oscillator stage delay. However, a skilled artisan would realize that the central functionality of HPDM circuit 1900, i.e., to provide precise measurement of a predetermined time quantum, would remain unaltered if DIVIDE-BY-64 circuit 1953, or similar divider circuit, were not included therein.

HPDM circuit 1900 can be used for many timing applications whether or not in the context of a memory structure, for example, to precisely shape pulsed waveforms and duty cycles; to skew, de-skew across one or more clocked circuits, or to measure the skew of such circuits; to provide high-precision test data; to indicate the beginning, end, or duration of a signal or event; and so forth. Furthermore, HPDM circuit 1900 can be applied to innumerable electronic devices other than memory structures, where precise timing measurement is desired.

Figure 20:
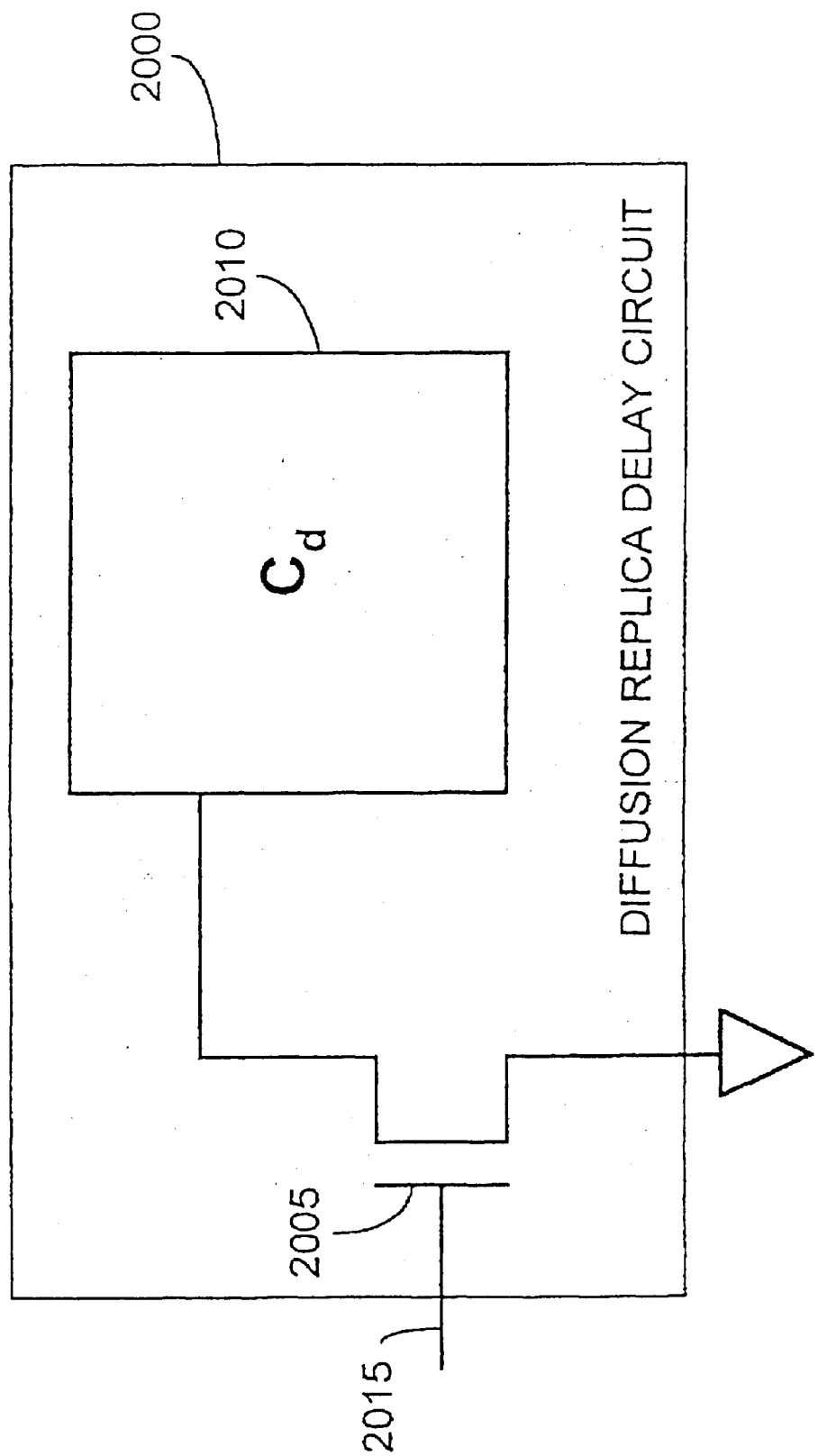
FIG. 20 is a simplified block diagram of one aspect of the present invention employing one embodiment of a diffusion replica delay circuit.

Accurate self-timed circuits are important features of robust, low-power memories. Replica bitline techniques have been described in the prior art to match the timing of control circuits and sense amplifiers to the memory cell characteristics, over wide variations in process, temperature, and operation voltage. One of the problems with some prior art schemes is that split dummy bitlines cluster word-lines together into groups, and thus only one word-line can be activated during a memory cycle. Before a subsequent activation of a word-line within the same group, the dummy bitlines must be precharged, creating an undesirable delay. The diffusion replica delay technique of the present invention substantially matches the capacitance of a dummy bitline by using a diffusion capacitor, preferably for each row. Some prior art techniques employed replica bit-columns which can add to undesirable operational delays. FIG. 20 illustrates the diffusion replica timing circuit 2000 which includes transistor 2005 and diffusion capacitance 2010. It is desirable that transistor 2005 be an NMOSFET transistor which, preferably, is substantially identical to an access transistor chain, if such is used in the memory cells of the memory structure (not shown). It also is desirable that the capacitance of diffusion capacitor 2010 is substantially matched to the capacitance of the associated bitline (not shown). This capacitance can be a predetermined ratio of the total bitline capacitance, with the ratio of the diffusion capacitance to total bitline capacitance remaining substantially constant over process, temperature and voltage variations. The total bitline capacitance can include both the bitline metal and diffusion capacitances. In this fashion, all rows in a memory device which use timing circuit 2000 can be independently accessible with substantially fully-operation self-timing, even when another row in the same memory module has been activated, and is not yet precharged. Thus, write-after-read operations may be multiplexed into a memory module without substantial access time or area penalties. Thus, it is desirable to employ diffusion replica delay circuit 2000 in a memory structure such as memory structure 1800, described in FIG. 18. Diffusion replica delay circuit 2000 can be used to determine the decay time of a bitline before a sense amplifier is activated, halting the decay on the bitline. In this manner, bitline decay voltage can be limited to a relatively small magnitude, thus saving power and decreasing memory access time. Furthermore, timing circuit 2000 can be used to accurately generate many timing signals in a memory structure such as structure 1800 in FIG. 18, including, without limitation, precharge, write, and shut-off timing signals.

Figure 21:
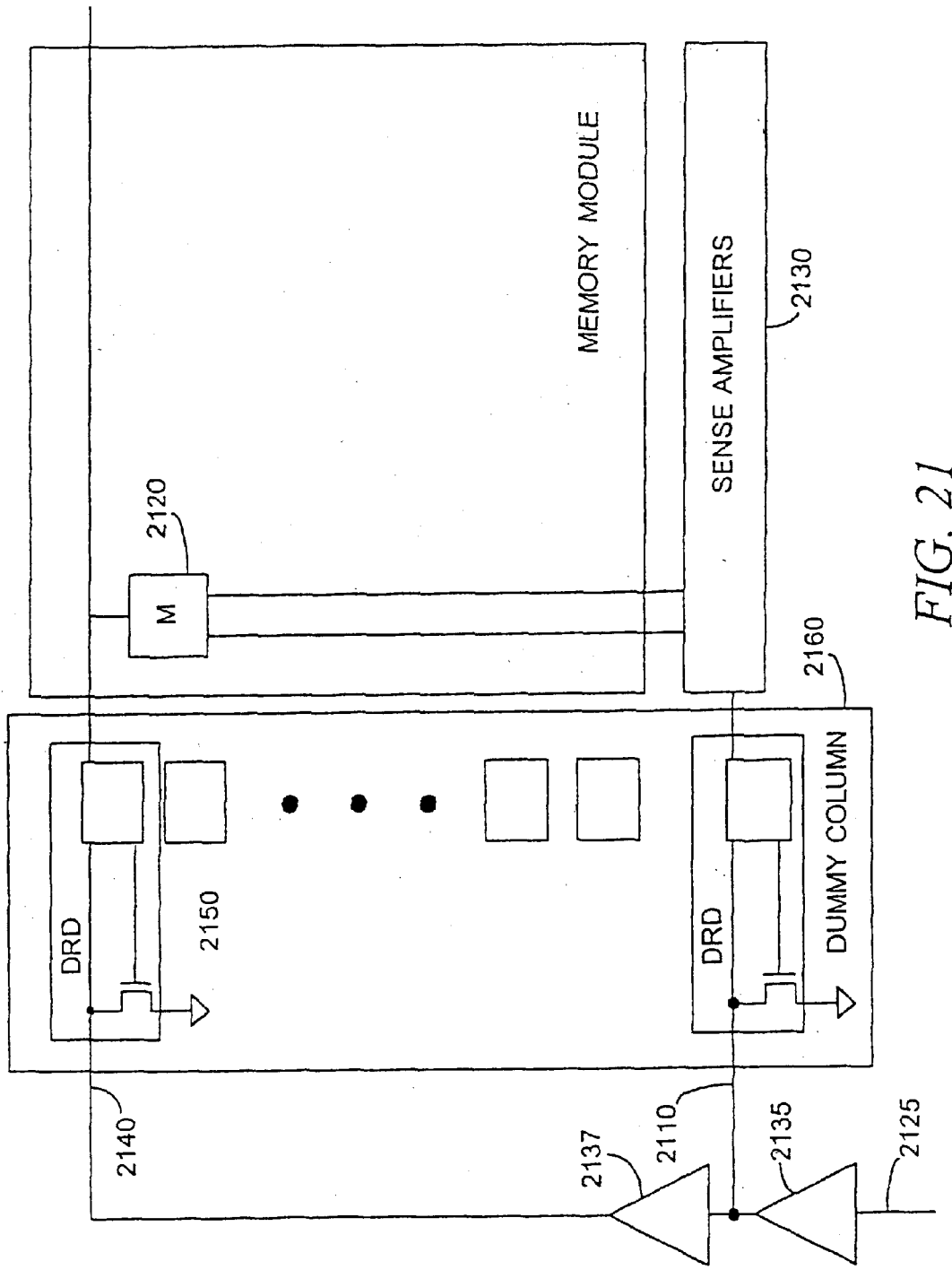
FIG. 21 is a simplified block diagram of one aspect of the present invention employing another embodiment of a diffusion replica delay circuit.

FIG. 21 illustrates an embodiment of the diffusion replica delay circuit 2000 in FIG. 20. Word-line activation of a memory cell frequency is pulsed to limit the voltage swing on the high capacitance bitlines, in order to minimize power consumption, particularly in wide word length memory structures. In order to accurately control the magnitude of a bitline voltage swing, dummy bitlines can be used. It is desirable that these dummy bitlines have a capacitance which is a predefined fraction of the actual bitline capacitance. In such a device, the capacitance ratio between dummy bitlines and real bitlines can affect the voltage swing on the real bitlines. In prior art devices using dummy bitlines, a global dummy bitline for a memory block having a global reset loop has been utilized. Such prior art schemes using global resetting tends to deliver pulse widths of a duration substantially equivalent to the delay of global wordline drivers. Such an extend pulse width allows for a bitline voltage swing which can be in excess of what actually is required to activate a sense amplifier. This is undesirable in fast memory structures, because the additional, and unnecessary, voltage swing translates into a slower structure with greater power requirements. In one aspect of the present invention, dummy bitlines are preferably partitioned such that the local bitlines generally exhibit a small capacitance and a short discharge time. Word-line pulse signals of very short duration (e.g., 500 ps or less) are desirable in order to limit the bitline voltage swing. It also may be desirable to provide local reset of split dummy bitlines to provide very short word-line pulses. Replica word-line 2110 can be used to minimize the delay between activation of memory cell 2120 and related sense amplifier 2130. Such local signaling is preferred over global signal distribution on relatively long, highly capacitive word-lines. Word-line 2140 activates dummy cell 2150 along with associated memory cell 2120, which is to be accessed. Dummy cell 2150 can be part of dummy column 2160 which may be split into small groups (for example, eight or sixteen groups). The size of each split dummy group can be changed to adjust the voltage swing on the bitline. When a dummy bitline is completely discharged, reset signal 2170 can be locally generated which pulls word-line 2140 substantially to ground.

Figure 22A:
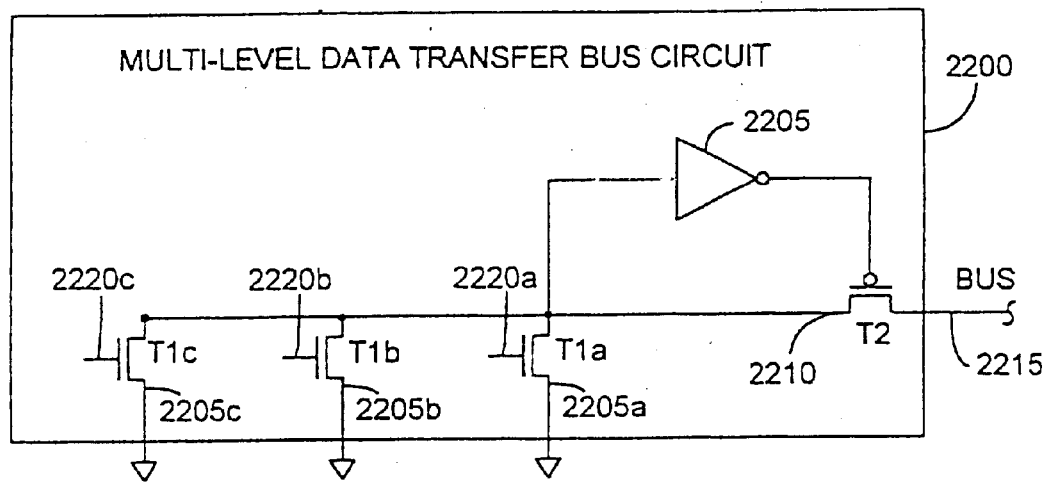
FIG. 22A is a schematic diagram of another aspect of an embodiment of the present invention, employing a high-speed, low-power data transfer bus circuit.

FIG. 22A illustrates controlled voltage swing data bus circuit (CVS) 2200 which can be useful in realizing lower power, high speed, and dense interconnection buses. CVS 2200 can reduce bus power consumption by imposing a limited, controlled voltage swing on bus 2215. In an essential configuration, CVS 2000 can include inverter 2205, pMOS pass transistor T2 2210, and one nMOS discharge transistor, such as transistor T1a 2205a. Both transistors T1a 2205a, and T2 2210 can be programmed to control the rate and extent of voltage swings on bus 2215 such that a first preselected bus operational characteristic is provided in response to input signal 2220a. Additional discharge transistors T1b 2205b and T1c 2205c can be coupled with pass transistor T2 2210, and individually programmed to respectively provide a second preselected bus operational characteristic, as well as a third preselected bus operational characteristic, responsive to respective input signals 2220b, 2220c. The preselected bus operational characteristic can be for example, the rate of discharge of the bus voltage through the respective discharge transistor T1a 2205a, T1b 2205b, and T1c 2205c, such that bus 2215 is disposed to provide encoded signals, or multilevel logic, thereon. For example, as depicted in FIG. 22A, CVS 2200 can provide three distinct logic levels. Additional discharge transistors, programmed to provide yet additional logic levels also may be used. Thus, it is possible for bus 2215 to replace two or more lines. Concurrently with effecting a reduction in power consumption, the limited bus voltage swing advantageously tends to increase the speed of the bus.

Figure 22B:
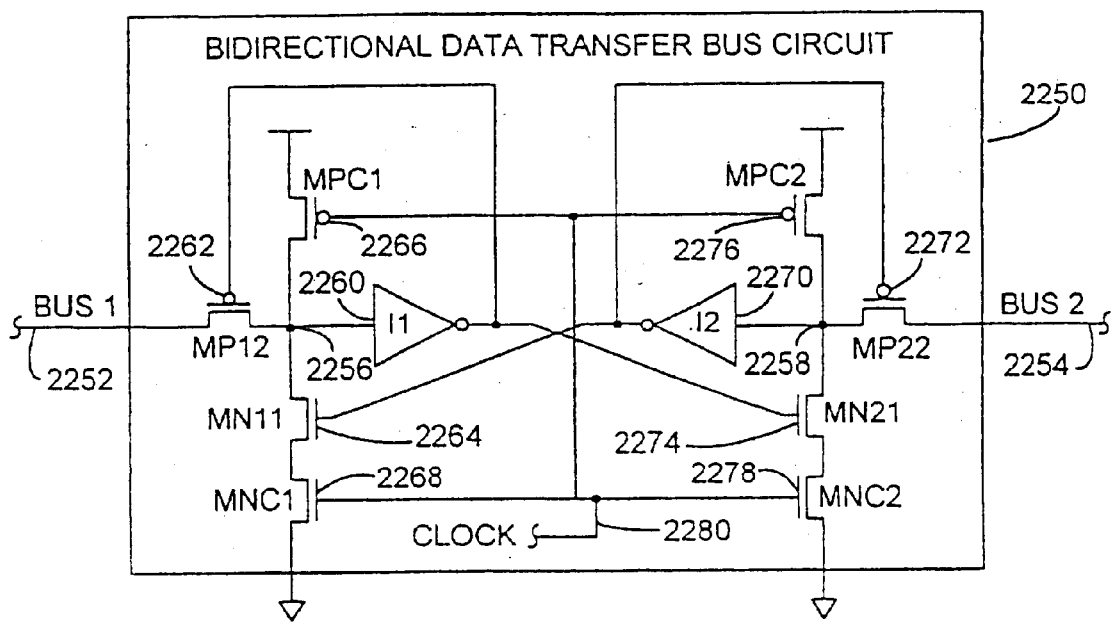
FIG. 22B is a schematic diagram of another aspect of an embodiment of the present invention, employing a high-speed, low-power data transfer bus circuit.

FIG. 22B illustrates a bidirectional data bus transfer circuit (DBDT) 2250 which employs cross-linked inverters I1 2260 and I2 2270 to couple BUS 1 2252 with BUS 2 2254. It is desirable to incorporate a clocked charge/discharge circuit with DBDT 2250. Coupled with inverter I1 2260 is clocked charge transistor MPC1 2266 and clocked discharge transistor MNC1 2268. Similarly, inverter I2 2270 is coupled with clocked charge transistor MPC2 2276 and clocked discharge transistor MNC2 2278. Transistors MPCL 2266, MNC1 2268, MPC2 2276, and MNC2 2278 are preferred to be driven by clock signal 2280.

Beginning with clock signal 2280 going LOW, charge transistors MPC1 2266 and MPC2 2276 turn ON, allowing BUS 1 input node 2256 and BUS 2 input node 2258 to be precharged to HIGH. Additionally, discharge transistors MNC1 2268 and MNC2 2278 are turned OFF, so that no substantial discharge occurs. By taking input nodes 2256, 2258 to HIGH, respective signals propagate through, and are inverted by inverters I1 2260 and I2 2270 providing a LOW signal to BUS 1 pass transistor MP12 2262 and BUS 2 pass MP22 2272, respectively, allowing the signal on BUS 1 2252 to be admitted to input node 2256, and then to pass through to BUS2 input node 2258 to BUS 2 2254, and vice versa. When clock signal 2280 rises to HIGH, both charge transistors MPC1 2266 and MPC2 2276 turn OFF, and discharge transistors MNC1 2268 and MNC2 2278 turn ON, latching the data-onto BUS 1 2252 and BUS 2 2254. Upon the next LOW phase of clock signal 2280, a changed signal value on either BUS 1 2252 or BUS 2 2254 will propagate between the buses.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A controlled voltage swing data bus circuit for transferring data to a data bus, comprising:
    a. a pass transistor coupled with the bus;
    b. a discharge transistor coupled with the pass transistor and ground; and
    c. an inverter coupled between the discharge transistor and the pass transistor, the inverter and the discharge transistor forming a signal node, the inverter selectably driving the pass transistor gate, responsive to a signal node voltage value.

2. The controlled voltage swing data bus circuit of claim 1, wherein the pass transistor is programmed to impose a second preselected bus operational characteristic on the data bus.

3. The controlled voltage swing data bus circuit of claim 1, further comprising a plurality of discharge transistors, ones of the plurality of discharge transistors being selectively programmed to impose respective preselected bus operational characteristics on the data bus.

4. The controlled voltage swing data bus circuit of claim 1, wherein the pass transistor couples the data bus with one of a global sense amplifier, a local sense amplifier, a global wordline decoder, and a local wordline decoder.

5. The controlled voltage swing data bus circuit of claim 2, wherein the pass transistor couples the data bus with one of a global sense amplifier, a local sense amplifier, a global wordline decoder, and a local wordline decoder.

6. A controlled voltage swing data bus transfer circuit for transferring data between a first data bus and a second data bus, comprising:
    a. a first inverter;
    b. a first pass transistor, coupled between the first data bus and the first inverter, the coupling of the first pass transistor and the first inverter forming a first signal node;
    c. a second inverter inverter;
    d. a second pass transistor, coupled between the second data bus and the second inverter, the coupling of the second pass transistor and the second inverter forming a second signal node;
    e. a first signal discharge transistor coupled between the first signal node and ground; and
    f. a second signal discharge transistor coupled between the second signal node and ground, wherein the first inverter transfers a signal representative of first data on the first data bus to the second signal discharge transistor and the second inverter transfers a signal representative of second data on the second data bus to the first signal discharge transistor.

7. The controlled voltage swing data bus transfer circuit of claim 6, further comprising:
    a. a first node charge transistor, coupled between $V_{dd}$ and the first signal node;
    b. a first node discharge transistor coupled between the first signal discharge transistor and ground;
    c. a second charge transistor, coupled between $V_{dd}$ and the second signal node;
    d. a second node discharge transistor coupled between the second signal discharge transistor and ground, wherein each of the first and second node charge transistors pull the respective first and second signal node to $V_{dd}$, when a LOW gate signal is applied thereto.

8. The controlled voltage swing data bus transfer circuit of claim 7, further comprising a clocking signal operably coupled with the first node charge transistor, the first node discharge transistor, the second node charge transistor, and the second node discharge transistor.

9. The controlled voltage swing data bus transfer circuit of claim 6, wherein one of the first data bus and the second data bus is coupled with one of a global sense amplifier, a local sense amplifier, a global wordline decoder, and a local wordline decoder.

10. The controlled voltage swing data bus transfer circuit of claim 8, wherein one of the first data bus and the second data bus is coupled with one of a global sense amplifier, a local sense amplifier, a global wordline decoder, and a local wordline decoder.

* * * * *